US009200956B2

(12) United States Patent
    Janesick

(10) Patent No.: US 9,200,956 B2
(45) Date of Patent: Dec. 1, 2015

(54) READOUT TRANSISTOR CIRCUITS FOR CMOS IMAGERS

(75) Inventor: James Robert Janesick, Huntington Beach, CA (US)

(73) Assignee: SRI INTERNATIONAL, Menlo Park, CA (US)

(*) Notice: Subject to any disclaimer, the term of this patent is extended or adjusted under 35 U.S.C. 154(b) by 875 days.

(21) Appl. No.: 13/169,242

(22) Filed: Jun. 27, 2011

(65) Prior Publication Data

US 2011/0315854 A1      Dec. 29, 2011

Related U.S. Application Data

(60) Provisional application No. 61/358,921, filed on Jun. 27, 2010, provisional application No. 61/407,993, filed on Oct. 29, 2010.

(51) Int. Cl.

| *H01L 27/00* | (2006.01) |
|---|---|
| *G01J 1/46* | (2006.01) |
| *H01L 27/146* | (2006.01) |
| *H04N 5/355* | (2011.01) |
| *H04N 5/3745* | (2011.01) |
| *H01L 27/12* | (2006.01) |
| *H01L 49/02* | (2006.01) |

(52) U.S. Cl.
CPC ............. *G01J 1/46* (2013.01); *H01L 27/14614* (2013.01); *H04N 5/3559* (2013.01); *H04N 5/37452* (2013.01); *H01L 27/1203* (2013.01); *H01L 27/1464* (2013.01); *H01L 27/14643* (2013.01); *H01L 28/40* (2013.01)

(58) Field of Classification Search
CPC .................. H01L 27/14614; H04N 5/37452; G01J 1/46

USPC ................ 250/208.1; 348/294, 308; 257/204
See application file for complete search history.

(56) References Cited

U.S. PATENT DOCUMENTS

| 5,262,871 | A  | * | 11/1993 | Wilder et al. ................ 348/307 |
|---|---|---|---|---|
| 5,900,623 | A  | * | 5/1999 | Tsang et al. ............... 250/208.1 |
| 6,054,704 | A  | * | 4/2000 | Pritchard et al. ........... 250/208.1 |
| 6,423,961 | B1 | * | 7/2002 | Niederkorn et al. ..... 250/214 LA |
| 6,583,817 | B1 | * | 6/2003 | Lee ............................... 348/241 |
| 7,486,322 | B2 | * | 2/2009 | Shinotsuka et al. .......... 348/308 |
| 7,598,481 | B2 | * | 10/2009 | Hwang et al. ............ 250/214 R |
| 2002/0060586 | A1 | * | 5/2002 | Watanabe ...................... 327/94 |
| 2007/0145503 | A1 | * | 6/2007 | Dierickx ........................ 257/431 |
| 2009/0114961 | A1 | * | 5/2009 | Ki ................................. 257/292 |
| 2014/0353472 | A1 | * | 12/2014 | Dierickx ........... H01L 27/14612 250/214 P |

* cited by examiner

*Primary Examiner* — Georgia Y Epps
*Assistant Examiner* — Kevin Wyatt
(74) *Attorney, Agent, or Firm* — Marger Johnson

(57) ABSTRACT

A readout transistor circuit for a pixel is disclosed. The readout transistor circuit includes a sense node. A reset transistor is in signal communication with the sense node. A source follower transistor is in signal communication with the sense node. A row select transistor is in signal communication with the source follower transistor. A switching transistor is in signal communication with the sense node. A capacitor is in signal communication with the switching transistor. The switching transistor is configured to place the capacitor in signal communication with the sense node to switch between a low voltage-per-charge (V/e−) ratio and a high voltage-per-charge (V/e−) to enable low noise performance of the sense node. The capacitor may be a metal-insulator-metal (MIM) capacitor. At least one of the reset transistor, the source follower transistor, the row select transistor, and the switching transistor may be a MOSFET. One or more of the MOSFETs may be a buried channel MOSFET.

22 Claims, 23 Drawing Sheets

READOUT TRANSISTOR CIRCUITS FOR CMOS IMAGERS

CROSS-REFERENCES TO RELATED APPLICATIONS

This application claims the benefit of U.S. provisional patent application No. 61/358,921 filed Jun. 27, 2010, and U.S. provisional patent application No. 61/407,993 filed Oct. 29, 2010, the disclosures of which are incorporated herein by reference in their entirety. This application is also related to copending U.S. Utility patent application Ser. No. 12/844,054, filed Jul. 27, 2010, the disclosure of which is incorporated by reference in its entirety.

FIELD OF THE INVENTION

The invention relates generally to imaging devices. More specifically, the invention relates to improving the performance of transistor readout circuits employed in CMOS imagers.

BACKGROUND OF THE INVENTION

Generally, an image sensor is a semiconductor device for converting an optical image into an electric signal. There are a number of different types of semiconductor-based imagers, including charge coupled devices (CCDs), photodiode arrays, charge injection devices, hybrid focal plane arrays, etc. The various types of image sensors may be broadly categorized as charge coupled devices (CCD) and complementary metal oxide semiconductor (CMOS) image sensors.

CCDs are often employed for image acquisition and enjoy a number of advantages which makes it attractive for many small size imaging applications. CCDs are also produced in large formats with small pixel size and they employ low noise charge domain processing techniques.

However, CCD imagers suffer from a number of disadvantages. For example, CCDs are susceptible to radiation damage; CCDs are often expensive to manufacture; CCDs require good light shielding to avoid image smear and; CCDs have a high power dissipation for large arrays. CCD imagers also have a complicated driving method and a complicated fabrication process requiring a multi-phased photo process. A control circuit, a signal processing circuit, an analog to digital (A/D) converter circuit, etc., cannot be easily integrated into a CCD chip, thereby inhibiting the use of CCDs in compact size products. While there have been some attempts to integrate on-chip signal processing with a CCD array, these attempts have not been entirely successful. CCDs also must transfer an image by linear charge transfers from pixel to pixel, requiring that the entire CCD array be read out into a memory before individual pixels or groups of pixels may be accessed and processed. This takes time. CCDs may also suffer from incomplete charge transfer from pixel to pixel during charge transfer which also results in image smear.

Because of the inherent limitations in CCD technology, there has been increased interest in CMOS imagers for possible use as low cost imaging devices. CMOS image sensors first came to the fore in relatively low-performance applications where shuttering was not required, scene dynamic range was low, and moderate to high noise levels could be tolerated. A CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, star trackers, motion detection systems, image stabilization systems and high-definition television imaging devices.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCDs since standard CMOS processing techniques may be used. Additionally, CMOS imagers exhibit low power consumption because only one row of pixels at a time needs to be active during readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

In a conventional CMOS pixel, input photons are converted to a corresponding electrical signal by, for example, a pinned photodiode. Readout circuitry couples the converted electrical signal in the form of an output voltage from a row transistor to an output terminal. In applications, a column of CMOS pixels may be coupled to the same output terminal. By selectively applying a row address signal to the gate of a selected row transistor, a selected one of the CMOS pixels may be coupled to the output terminal.

A prior art method for converting an analog signal present on a column output terminal to a digital signal for use by digital imager circuitry using A/D conversion requires two analog-to-digital converters (hereinafter ADC or ADCs) per column to obtain a large dynamic range per column. There is a high and low gain ADC. The high gain ADC is relatively immune to noise but saturates at a relative low input signal level. The second ADC has a low front end gain and provides for a much larger dynamic range of input but has relatively high referred electron noise. The two ADC outputs are spliced to form a single data signal with fewer bits having low noise and large dynamic range.

For example, the high gain ADC provides a saturation level of 1000 e/pixel (i.e., charges per pixel) relative to a pixel full signal of 25,000 e/pixel. The second ADC has low front end gain and provides for an input signal of up to 25,000 e/pixel at saturation but has relatively high noise because of low front end gain. The two spliced ADC output form a single digital signal having noise of about 2 e/pixel (rms) and a full signal of 25,000 e/pixel. When employing this ADC architecture, the pixel itself needs to provide an output signal over this full dynamic range.

For imagers that operate at relatively high data rates, such as one having 5 Megapixels and configured to operate at 100 fps, typically 8 to 16 digital output ports may be required. For the dual ADC per column approach using 11-bit ADCs, about 174 extra bonds pads and package pins are required. This results in higher packaging costs, greater camera complexity and higher on-chip power dissipation. Increased chip power dissipation is undesirable because it may result in a higher dark current, resulting in an imager that has reduced sensitivity or a need for increased cooling.

Accordingly, what would be desirable, but has not yet been provided, is a CMOS imager readout transistor circuit that switches between a low voltage-per-charge (V/e−) ratio and a high voltage-per-charge (V/e−) to enable low noise performance. Also desirable is a CMOS imager having a single ADC per column capable of achieving both low noise and a large full signal (dynamic range).

SUMMARY OF THE INVENTION

The above-described problems are addressed and a technical solution achieved in the art by providing an improved readout circuit for a CMOS image sensor, comprising: a readout transistor circuit for a pixel, comprising: a sense node; a reset transistor in signal communication with the sense node; a source follower transistor in signal communication with the sense node; a row select transistor in signal communication with the source follower transistor; a switching transistor in signal communication with the sense node; and a capacitor in signal communication with the switching transistor, wherein the switching transistor is configured to place the capacitor in signal communication with the sense node to switch between a low voltage-per-charge (V/e−) ratio and a high voltage-per-charge (V/e−) to enable low noise performance of the sense node. The capacitor may be a metal-insulator-metal (MIM) capacitor. The metal-insulator-metal (MIM) capacitor may be connected in series with the switching transistor and the reset transistor, the MIM capacitor coupled between the switching transistor and the reset transistor. Alternatively, the switching transistor may be connected in parallel with the reset transistor.

According to an embodiment of the present invention, one or more of the reset transistor, the source follower transistor, the row select transistor, and the switching transistor may be a MOSFET.

According to an embodiment of the present invention, one or more of the reset transistor, the source follower transistor, the row select transistor, and the switching transistor may be a buried channel MOSFET. The sense node may include a photon-to-charge-converter comprising at least one of a pinned photo diode (PPD), a photo-gate, and a photodiode.

According to an embodiment of the present invention, the readout transistor circuit may further comprise: a source follower transistor in signal communication with the row select transistor for outputting an analog electrical signal derived from the sense node to a column line, and at least one of an analog signal processor and an analog-to-digital converter (ADC) in signal communication with the column line.

The above-described problems are addressed and a technical solution achieved in the art by providing an imager, comprising: a pixel array comprising a plurality of pixels arranged in a predetermined number of columns and rows selected by a plurality of column select lines and row select lines, respectively; wherein each pixel of the pixel array comprises: a sense node; a reset transistor in signal communication with the sense node; a source follower transistor in signal communication with the sense node; a row select transistor in signal communication with the source follower transistor; a switching transistor in signal communication with the sense node; and a capacitor in signal communication with the switching transistor, wherein the switching transistor is configured to place the capacitor in signal communication with the sense node to switch between a low voltage-per-charge (V/e−) ratio and a high voltage-per-charge (V/e−) to enable low noise performance of the sense node. The capacitor may be metal-insulator-metal (MIM) capacitor.

The metal-insulator-metal (MIM) capacitor may be either connected in series with the switching transistor and the reset transistor, the MIM capacitor coupled between the switching transistor and the reset transistor. Alternatively, the switching transistor may be connected in parallel with the reset transistor.

According to an embodiment of the present invention, one or more of the reset transistor, the source follower transistor, the row select transistor, and the switching transistor may be a MOSFET.

According to an embodiment of the present invention, one or more of the reset transistor, the source follower transistor, the row select transistor, and the switching transistor may be a buried channel MOSFET. The sense node may include a photon-to-charge-converter comprising at least one of a pinned photo diode (PPD), a photo-gate, and a photodiode.

According to an embodiment of the present invention, the readout transistor circuit may further comprise: a source follower transistor in signal communication with the row select transistor for outputting an analog electrical signal derived from the sense node to a column line, and at least one of an analog signal processor and an analog-to-digital converter (ADC) in signal communication with the column line.

According to an embodiment of the present invention, the imager may further comprise: a row driver and a row address decoder in signal communication with the row driver, wherein the row driver is configured for selectively activating at least one of row select lines in response to the row address decoder; a column driver and a column address decoder in signal communication with the column driver for selectively activating at least one of column select lines in response to the column address decoder; a control circuit for controlling the row address decoder and column address decoder for selecting at least one row and column line for pixel readout; and row and column driver circuitry configured for driving voltage to drive transistors of the selected at least one row and column lines.

According to an embodiment of the present invention, the imager may further comprise: a processor in signal communication with at least one of an analog signal processor and an analog-to-digital converter (ADC). The processor may employ a digital correlated double sampling method whereby a reference sample and a signal sample are differenced on a pixel-by-pixel basis.

BRIEF DESCRIPTION OF THE DRAWINGS

The present invention may be more readily understood from the detailed description of an exemplary embodiment presented below considered in conjunction with the attached drawings and in which like reference numerals refer to similar elements and in which.

It is to be understood that the attached drawings are for purposes of illustrating the concepts of the invention and may not be to scale.

DETAILED DESCRIPTION OF THE INVENTION

Figure 1:
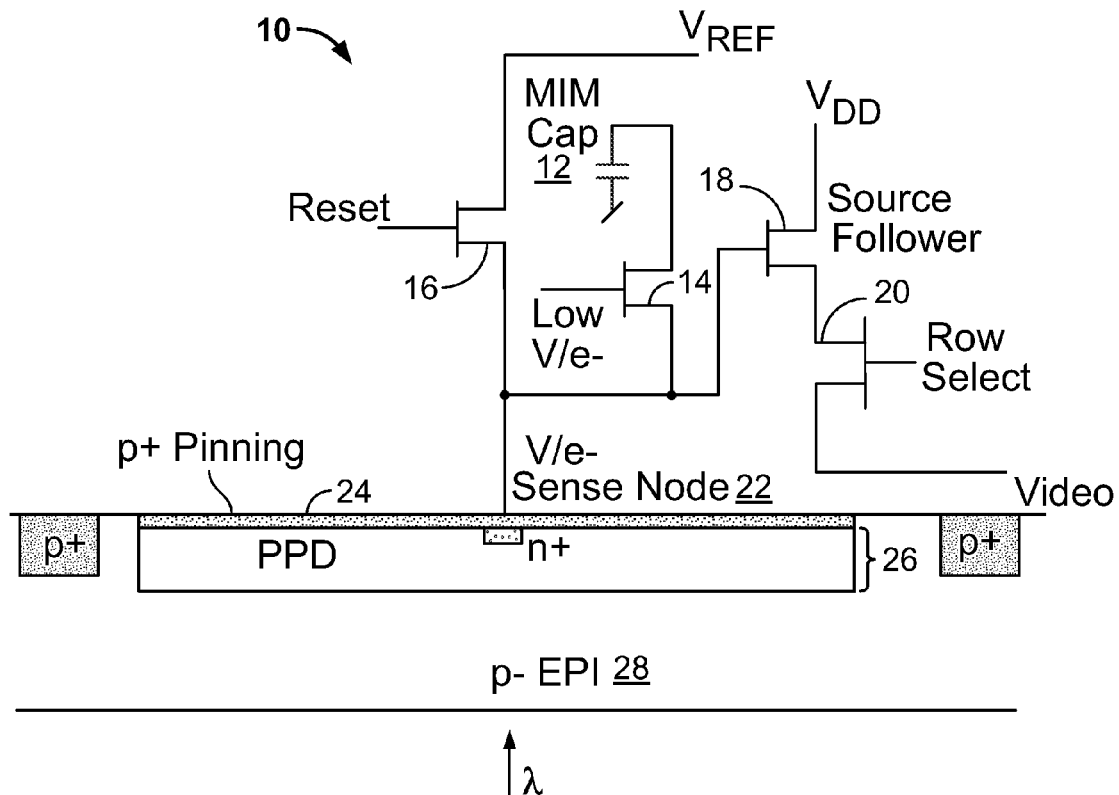
FIG. 1 depicts a side view of a high dynamic range back-illuminated n-type CMOS 4T pixel (hereinafter an "n_4TPPD pixel") employing a metal-insulator-metal (MIM) capacitor, according to an embodiment of the present invention.

FIG. 1 depicts a side view of a high dynamic range back-illuminated n-type CMOS 4T pixel 10 (hereinafter an "n_4TPPD pixel 10"), according to an embodiment of the present invention. The n_4TPPD pixel 10 is formed from a conventional n-type CMOS 3T pixel having three NMOS type readout transistors with the addition of a metal-insulator-metal (MIM) capacitor 12 and a MOSFET 14 (hereinafter "the MIM MOSFET 14"). The n_4TPPD pixel 12 includes a reset transistor 16, a source follower transistor 18, and a row select transistor 20 communicatively connected to a sense node 22. The sense node 22 comprises a thin p+ layer 24 for pinning a pixel photodiode (PPD) 26. The PPD 26 is formed in a p– epi layer 28. As illustrated in FIG. 1, a high dynamic range n_4TPPD pixel 10 results when the MIM capacitor 12 is switched onto the sense node 22 with the MIM MOSFET 14. One terminal of the MIM capacitor 12 is electrically connected to the source terminal of the MIM MOSFET 14. A second terminal of the MIM capacitor 12 is connected to ground potential. The drain terminal of the MIM MOSFET 14 is connected to the source terminal of the reset transistor 16 which is also electrically connected to the sense node 22.

Although the n_4TPPD pixel 20 depicts a sense node 22 comprising a PPD 26, certain embodiments of the present invention are not limited to PPDs. The PPD 26 of the n_4TPPD pixel 10 may be any form of a photon-to-charge-converter 26 (e.g., a pinned photo diode, a photo-gate, a photodiode, etc., hereinafter referred to as the PPD 26).

Figure 2A:
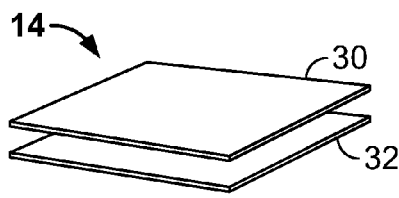
FIGS. 2A and 2B show the MIM capacitor as depicted in FIG. 1 modeled as a pair of rectangular parallel plates and the resulting fields between and around the plates, respectively.
Figure 2B:
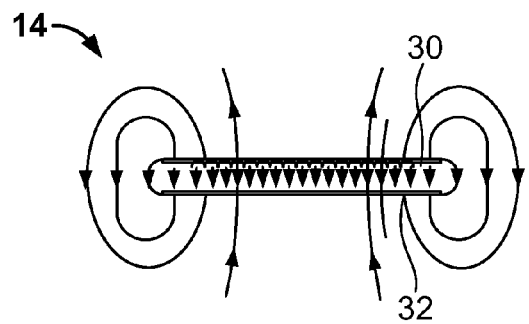
Figure 3:
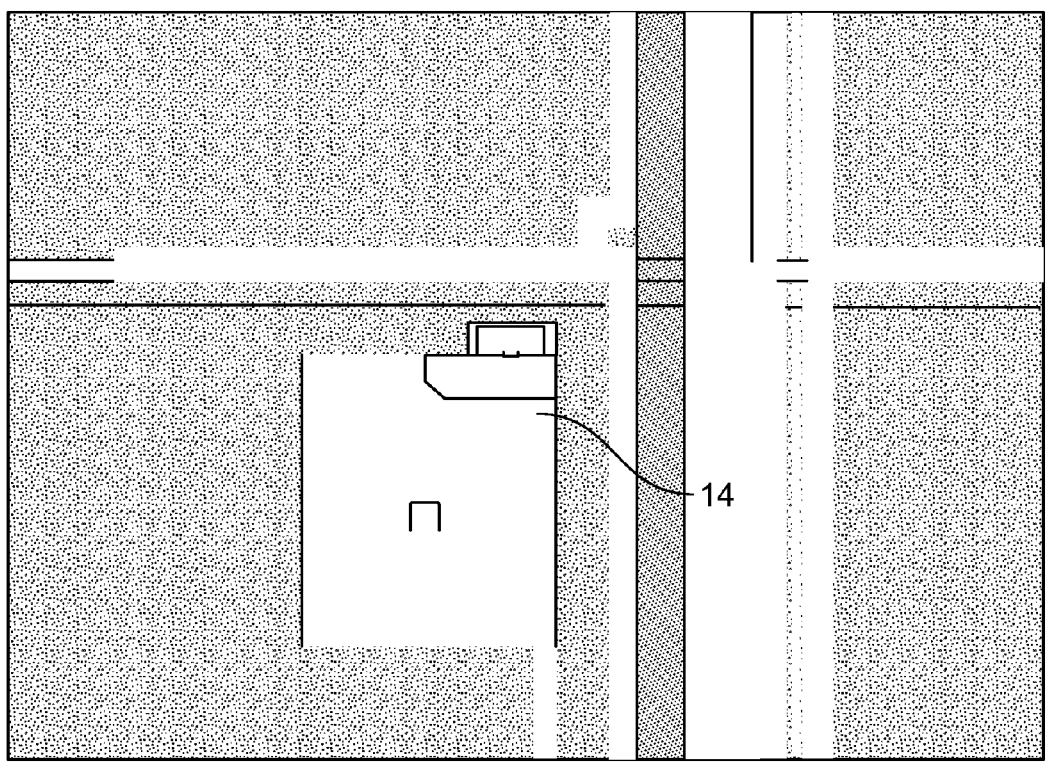
FIG. 3 is a layout of the MIM capacitor of FIGS. 2A and 2B.

FIGS. 2A and 2B show the MIM capacitor 12 modeled as a pair of rectangular parallel plates and the resulting fields between and around the plates 30, 32, respectively. FIG. 3 is a layout of the MIM capacitor 12. According to the equation for the capacitance for two parallel plates:

$$C = \varepsilon_r \varepsilon_0 \frac{A}{d}$$

where
C is the capacitance, in farads;
A is the area of overlap of the two plates, in square meters;
$\varepsilon_r$ is the relative static permittivity (sometimes called the dielectric constant) of the material between the plates (for a vacuum, $\varepsilon_r=1$);
$\varepsilon_0$ is the electric constant ($\varepsilon_0 \approx 8.854 \times 10^{-12}$ F m$^{-1}$); and
d is the separation between the plates, in meters.

Capacitance is proportional to the area of overlap and inversely proportional to the separation between conducting sheets. The closer the sheets are to each other, the greater the capacitance. The equation is a good approximation if d is small compared to the other dimensions of the plates so the field in the capacitor over most of its area is uniform, and the so-called fringing field around the periphery provides a small contribution.

Figure 4A:
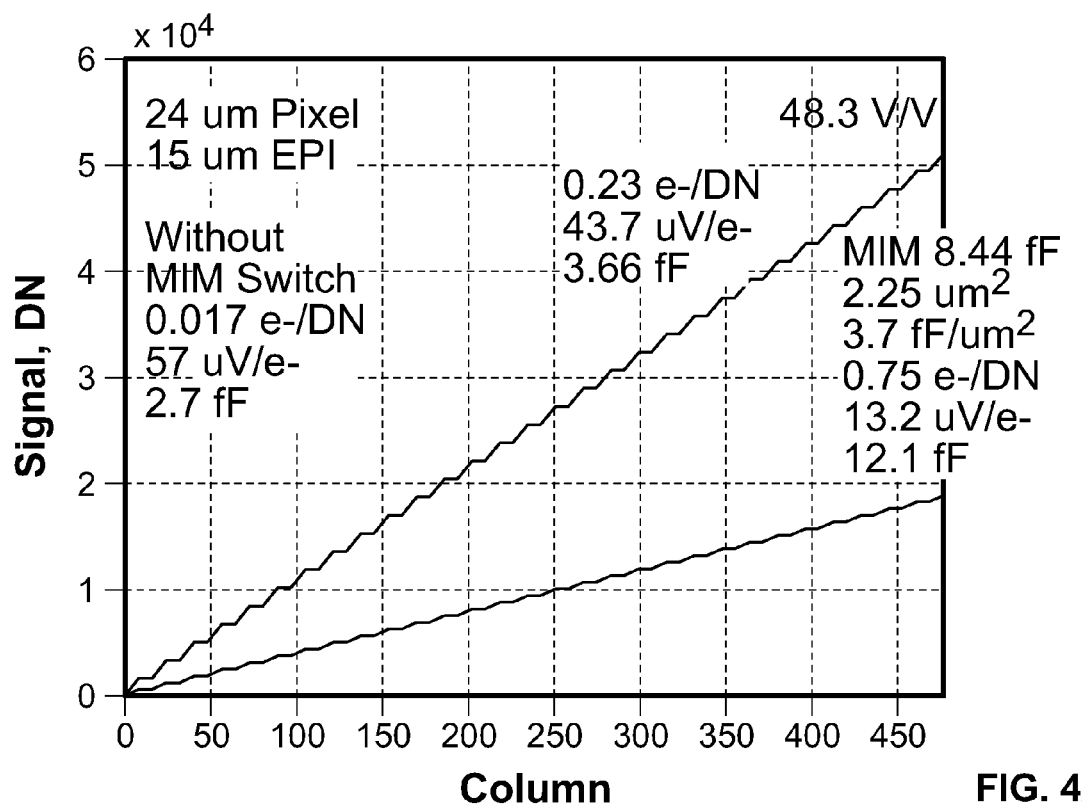
FIGS. 4A-4E plot signal output with varying amounts of MIM capacitance.
Figure 4B:
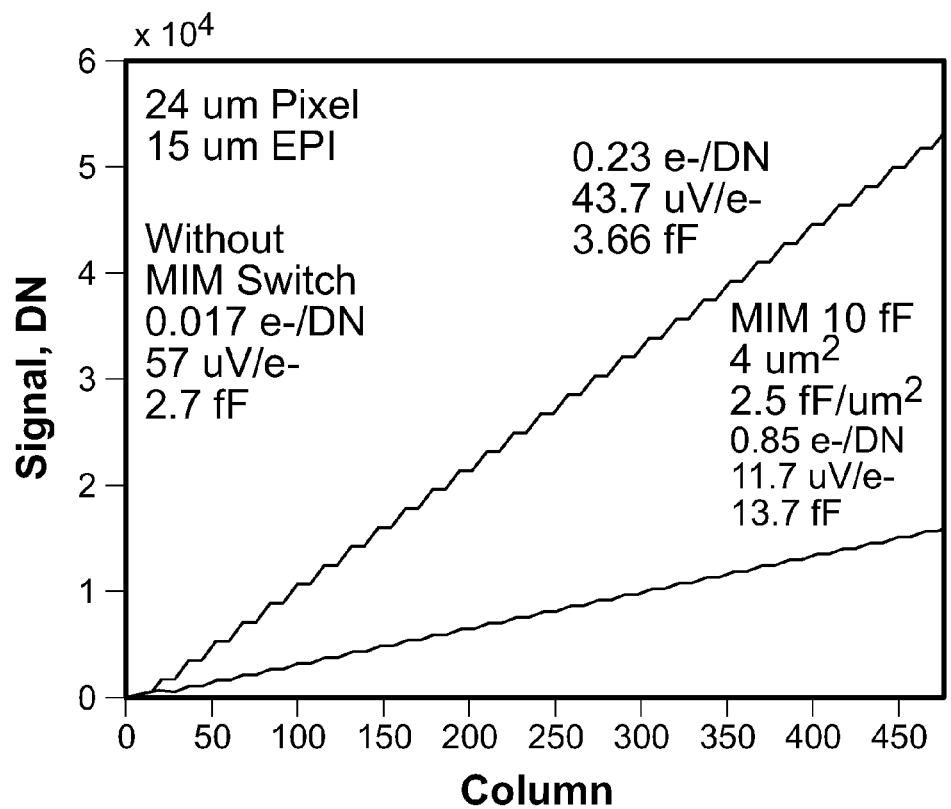
Figure 4C:
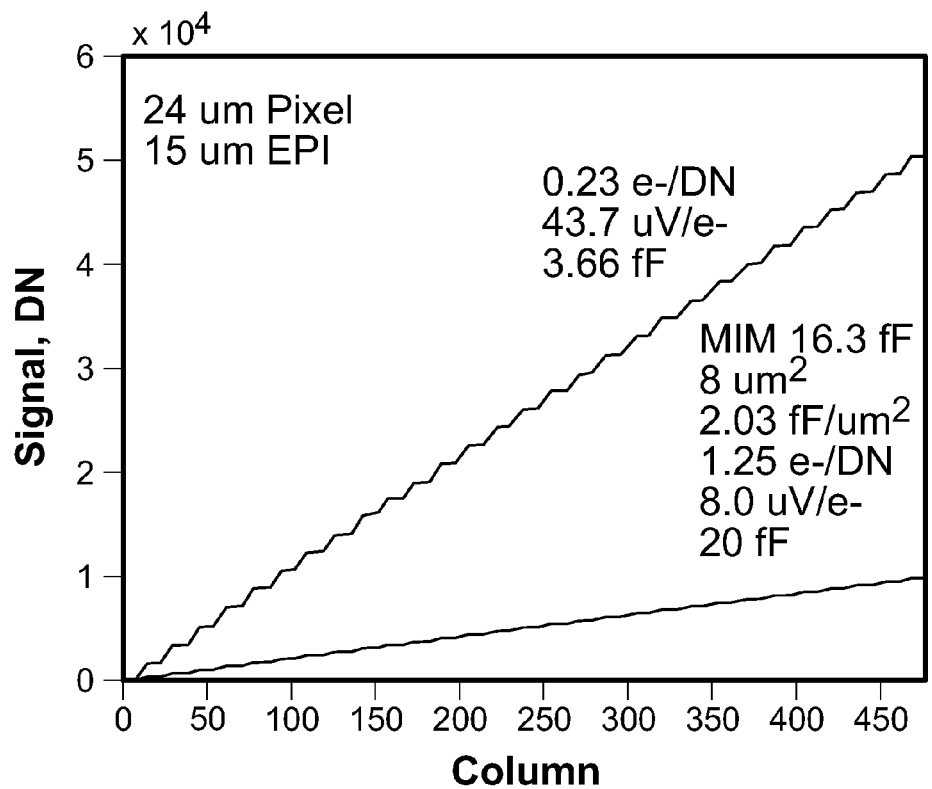
Figure 4D:
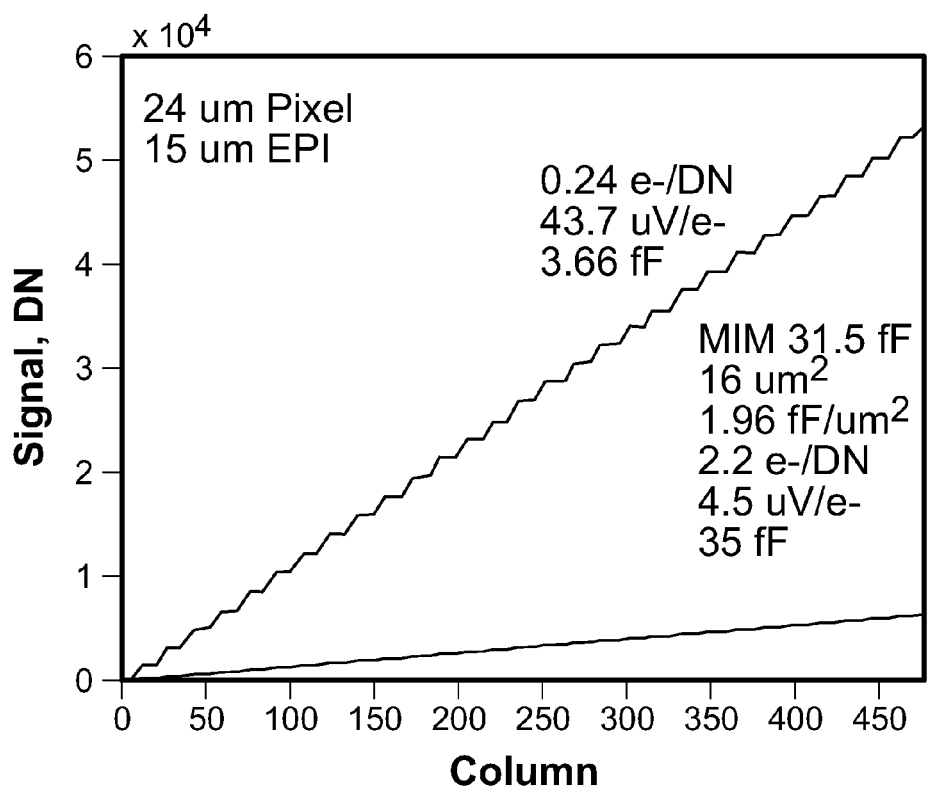
Figure 4E:
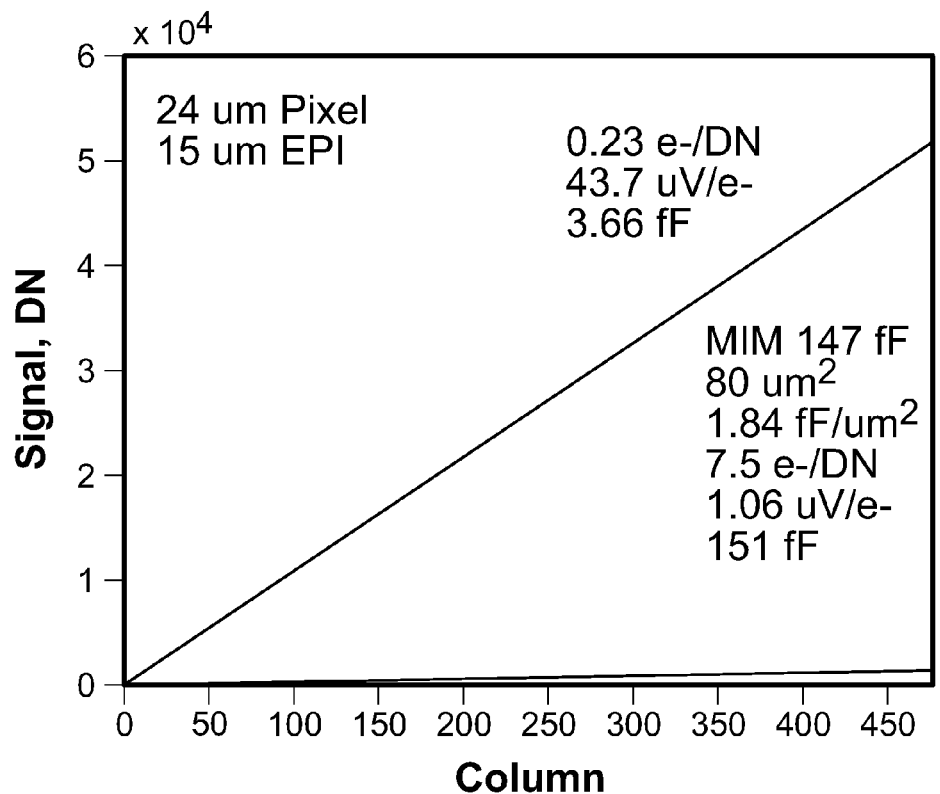

FIGS. 4A-4E plot signal output with varying amounts of MIM capacitance from 4.5fF (the smallest possible capacitance allowed by current CMOS design rules (1.5 um×1.5 um)) in FIG. 4A to 147 fF in FIG. 4E, while V/e− ranges from 57 uV/e− with no MIM capacitance to 1.06 uV/e− in FIG. 4E for a much wider dynamic range.

Figure 5:
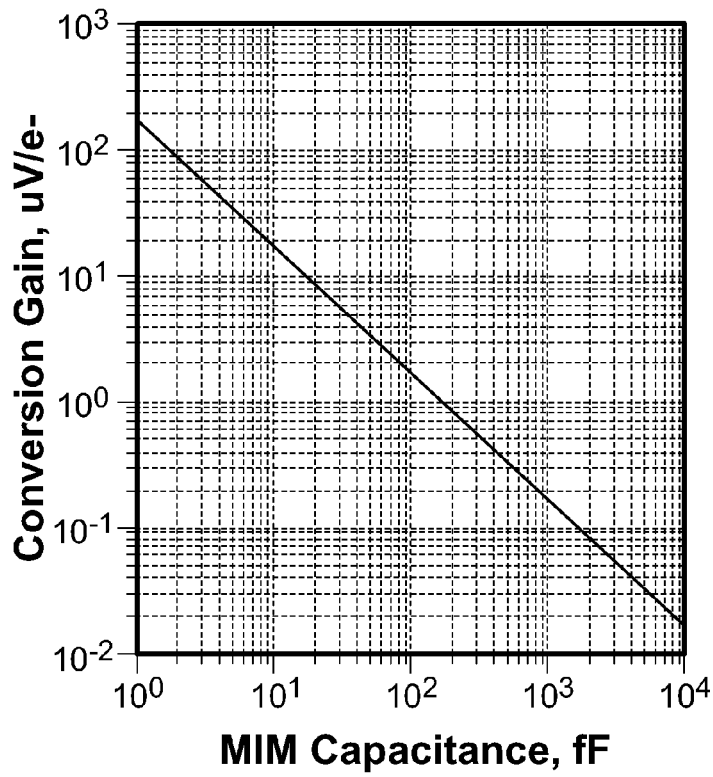
FIG. 5 plots conversion gain as a function of total capacitance related to the sense node of the pixel of FIG. 1.
Figure 6:
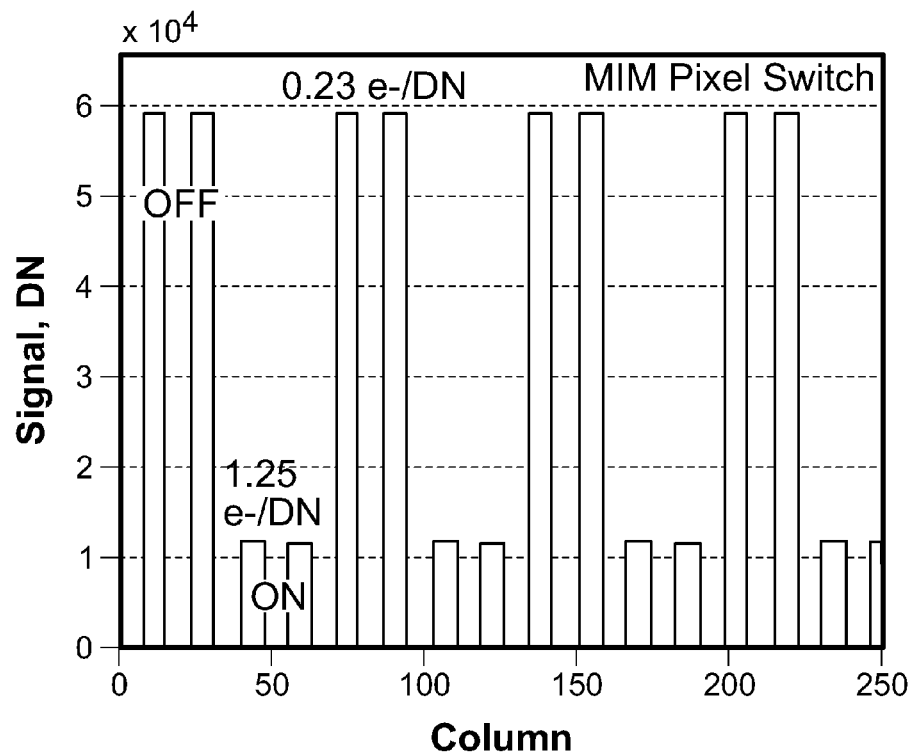
FIG. 6 shows a MIM capacitor switching between two states.

FIG. 5 plots the conversion gain as a function of total capacitance related to the sense node 28. The gain may be changed very rapidly. For example, a row of pixels may be read twice with low and high V/e− for extended dynamic range as depicted in FIG. 6. FIG. 6 shows the MIM switch in action, switching between 0.23 e−/DN to 1.25 e−/DN. As a result, fast non-destructive readout may be employed using a switched MIM capacitance when switching between the two states. This wide dynamic range feature will be described in greater detail in connection with FIG. 20.

Figure 7A:
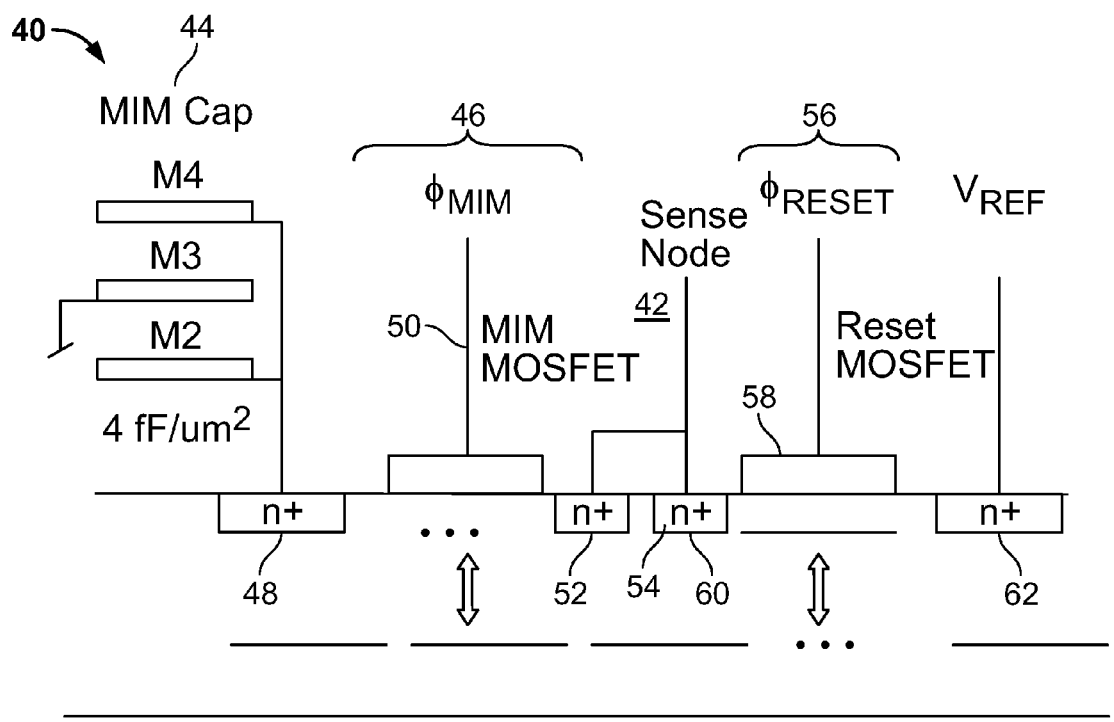
FIG. 7A is a side view of a "parallel" MIM pixel layout in the vicinity of a sense node employing n-type transistors (NMOS pixel), according to an embodiment of the present invention.
Figure 7B:
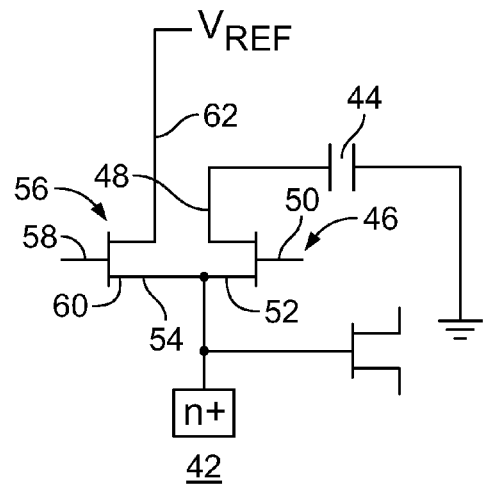
FIG. 7B is a corresponding circuit schematic diagram of FIG. 7A, according to an embodiment of the present invention.

FIG. 7A is a side view of a "parallel" MIM pixel layout 40 in the vicinity of a sense node 42 employing n-type transistors (NMOS pixel), according to an embodiment of the present invention. FIG. 7B is a corresponding circuit schematic diagram of FIG. 7A, according to an embodiment of the present invention. The "parallel" configuration of FIGS. 7A and 7B is substantially the same as that of FIG. 1, except that the MIM capacitor 44 is constructed of a plurality of parallel plates M2-M4 as shown. An M4 to M3 capacitor is configured in parallel with an M2 to M3 capacitor (M3 is at ground potential). The two capacitors are stacked to keep pixel fill factor large. This configuration doubles the capacitance. As a result, a 4 fF/um$^2$ is achieved (area of the three metals).

Referring again to FIGS. 7A and 7B, the "parallel" MIM pixel layout 40 includes the MIM capacitor 44, of which one terminal (i.e., the plates M2 and M4) is electrically connected to an n+ source 48 of the MIM MOSFET 46. A second terminal (i.e., the plate M3) of the MIM capacitor 44 is connected to ground potential. A MIM MOSFET gate 50 is located between the n+ source 48 and an n+ drain 52 of the MIM MOSFET 46. The n+ drain 52 of the MIM MOSFET 46 is connected to the n+ source 54 of the reset MOSFET 56 with a gate 58 located between the n+ source 60 and an n+ drain 62 of the reset MOSFET 56. The n+ drain 62 of the MIM MOSFET 46 is connected to the n+ source 60 of the reset MOSFET 56 function as a sense node 42. The n+ drain 62 of the reset MOSFET 56 is connected to positive potential (i.e., V$_{REF}$).

Figure 7C:
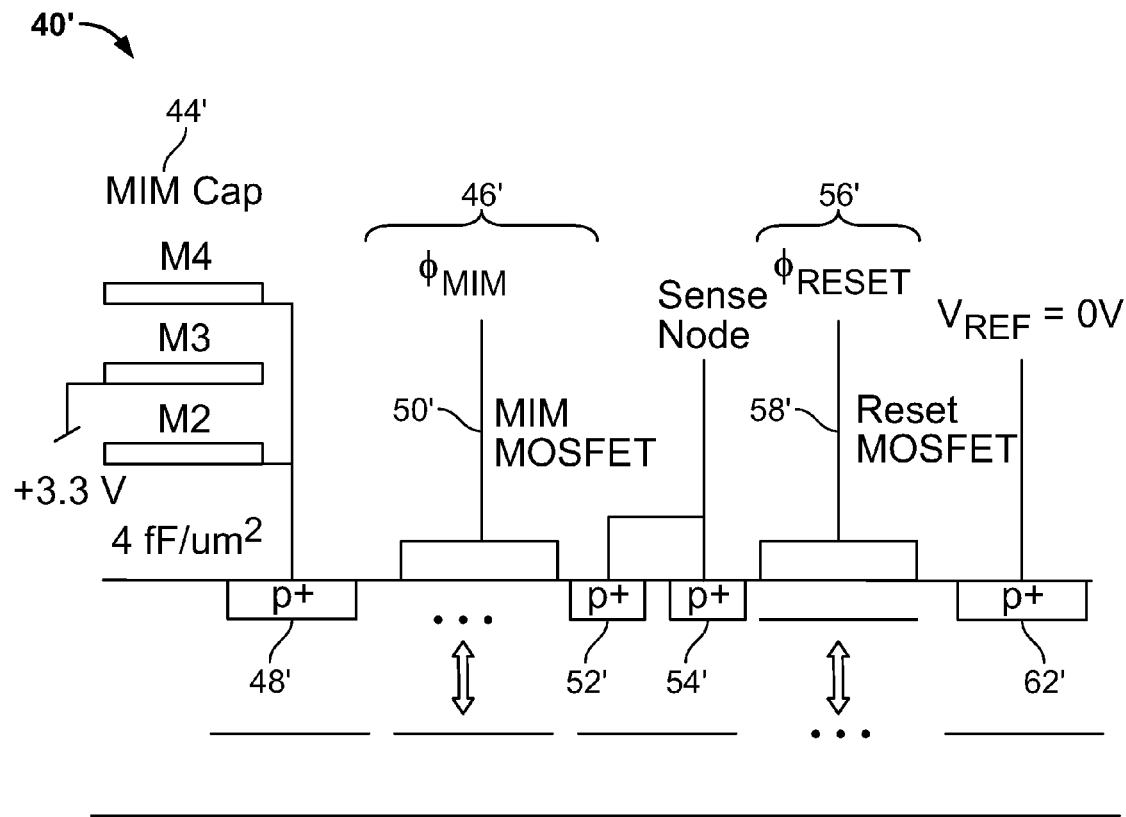
FIG. 7C is a side view of a "parallel" MIM pixel layout in the vicinity of a sense node employing p-type transistors (PMOS pixel), according to an embodiment of the present invention.
Figure 7D:
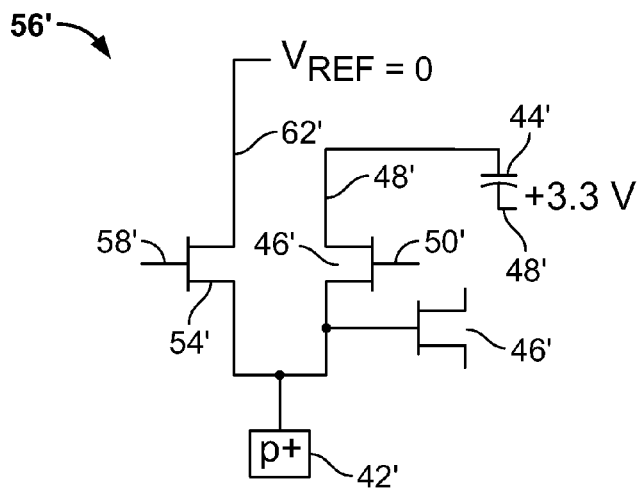
FIG. 7D is a corresponding circuit schematic diagram of FIG. 7C, according to an embodiment of the present invention.

FIG. 7C is a side view of a "parallel" MIM pixel layout 40' in the vicinity of a sense node 42' employing p-type transistors (PMOS pixel), according to an embodiment of the present invention. FIG. 7D is a corresponding circuit schematic diagram of FIG. 7C, according to an embodiment of the present invention. An M4 to M3 capacitor is configured in parallel with an M2 to M3 capacitor (M3 is at ground potential). The "parallel" MIM pixel layout 40' includes the MIM capacitor 44', of which one terminal (i.e., the plates M2 and M4) is electrically connected to an p+ drain 48' of the MIM MOSFET 46'. A second terminal (i.e., the plate M3) of the MIM capacitor 44' is connected to positive (about +3.3V) potential. A MIM MOSFET gate 50' is located between the p+ drain 48' and a p+ source 52' of the MIM MOSFET 46'. The p+ source 52' of the MIM MOSFET 46' is connected to the p+ source 54' of the reset MOSFET 56' with a gate 58' located between the p+ source 54' and an p+ drain 62' of the reset MOSFET 56', wherein the p+ source 54' functions as the sense node 42'. The p+ drain 62' of the reset MOSFET 56' is connected to low potential (i.e., V$_{REF}$=0V).

Figure 8:
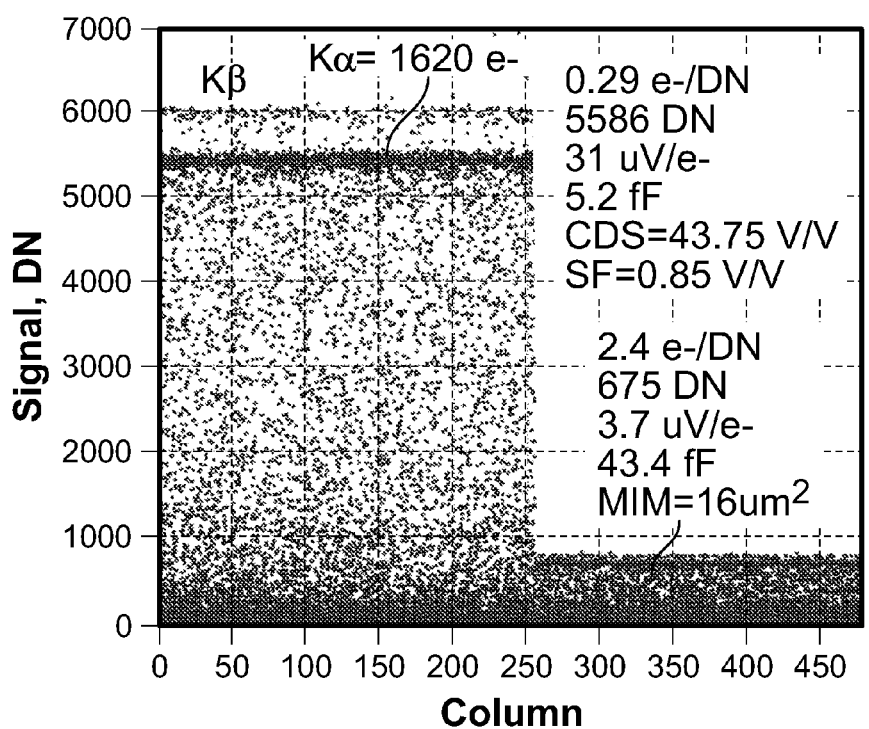
FIG. 8 shows a "parallel" MIM pixel response to Fe-55 x-rays where the sensitivity switches from 31 to 3.7 uV/e–.
Figure 9:
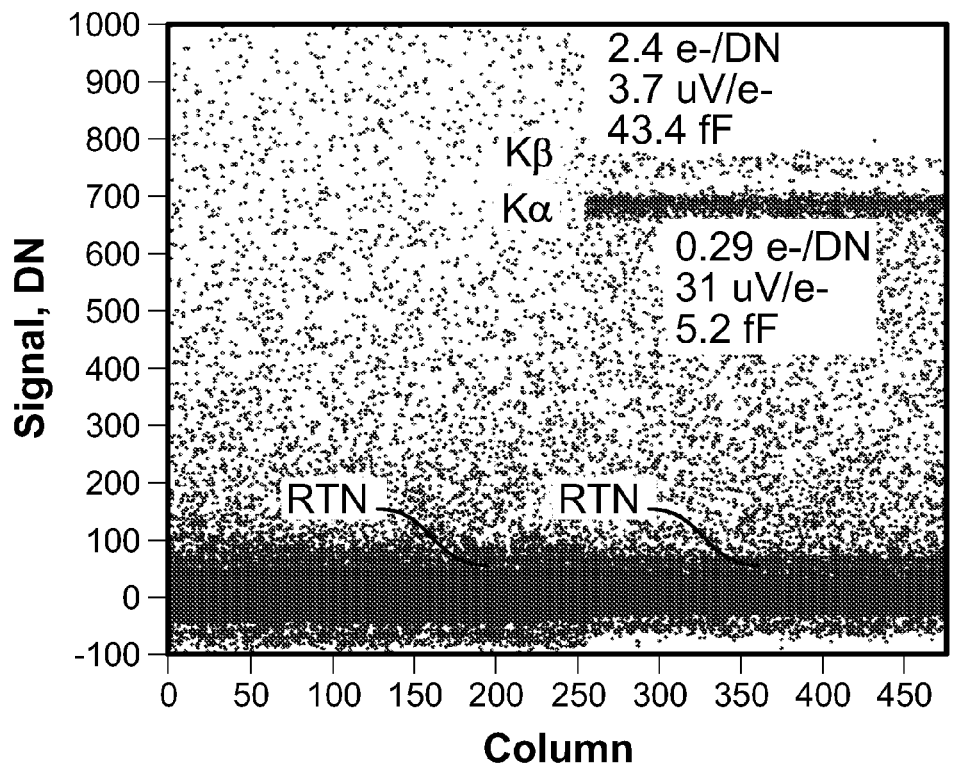
FIG. 9 magnifies this plot showing good separation of the K-α and K-β lines indicating that low noise performance is maintained for a low gain state.
Figure 10:
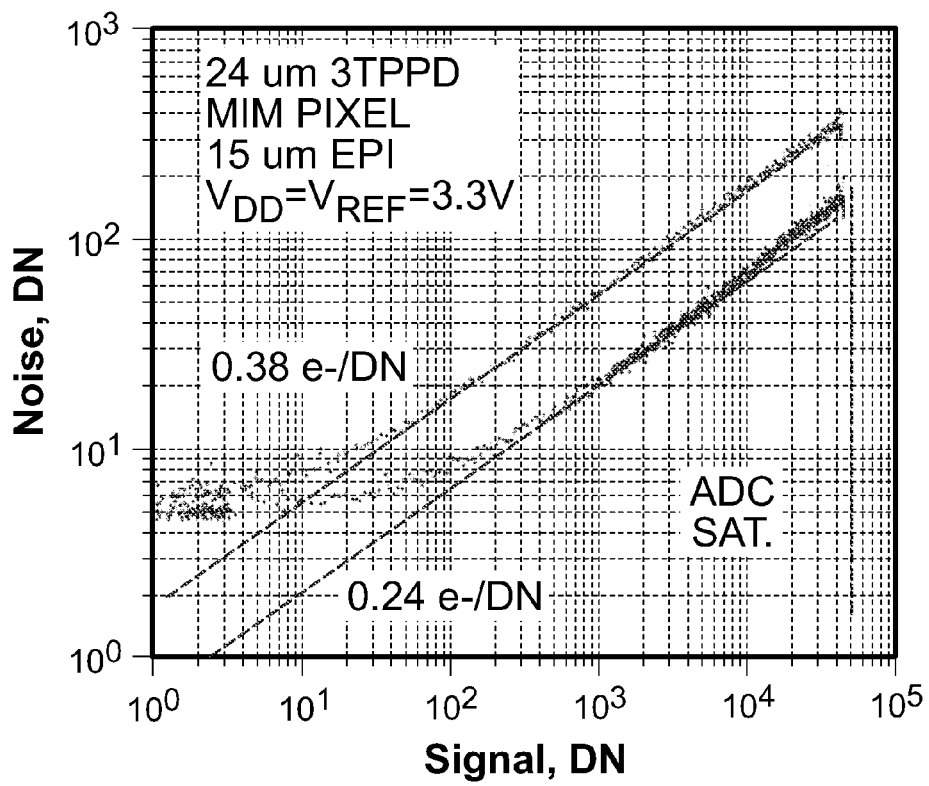
FIG. 10 shows PTCs that exercise the two gain states (expressed in DN and electron units)

FIG. 8 shows a "parallel" MIM pixel response to Fe-55 x-rays where the sensitivity switches from 31 to 3.7 uV/e−. FIG. 9 magnifies this plot showing good separation of the K-α and K-β lines indicating that low noise performance is maintained for low gain state. FIG. 10 shows PTCs that exercise the two gain states (expressed in DN and electron units). Note that electron read noise approximately scales with the gain change (i.e., 2.4 e−/DN and 0.38 e−/DN) whereas DN noise levels are nearly equal for both gain states. This is because read noise is generated by the pixel's source follower down stream of the sense node.

Figure 11A:
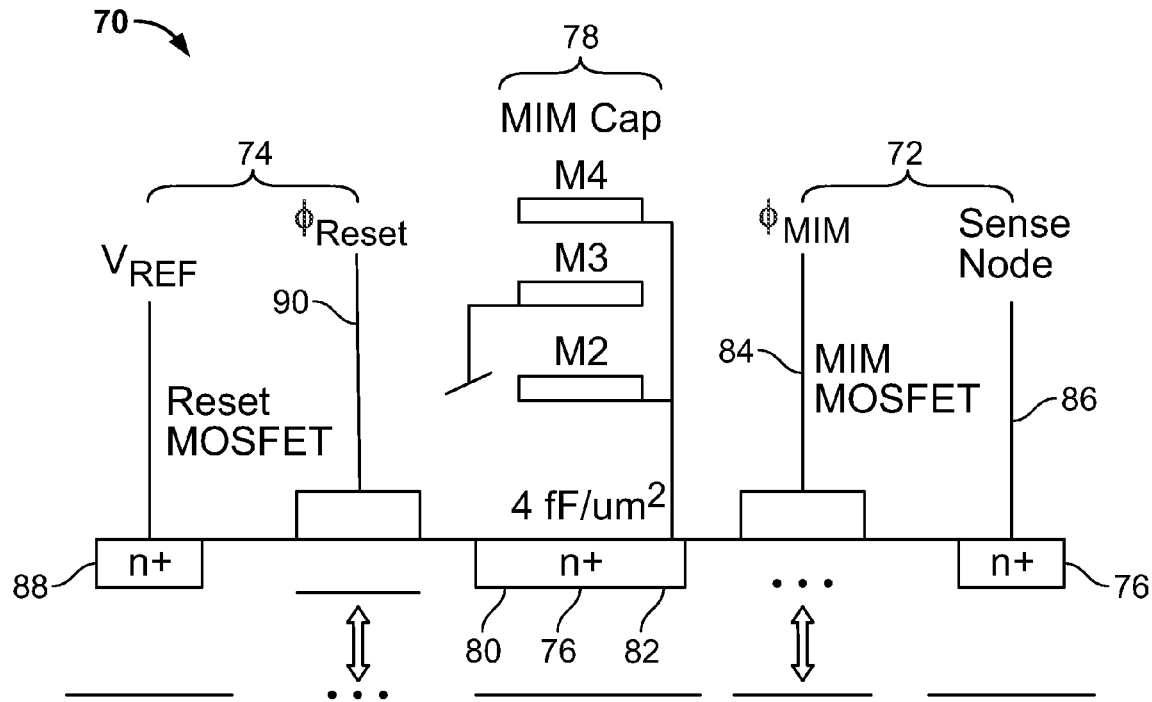
FIG. 11A is a side view of a "series" MIM pixel layout in the vicinity of a sense node employing n-type transistors (NMOS pixel), according to an embodiment of the present invention.
Figure 11B:
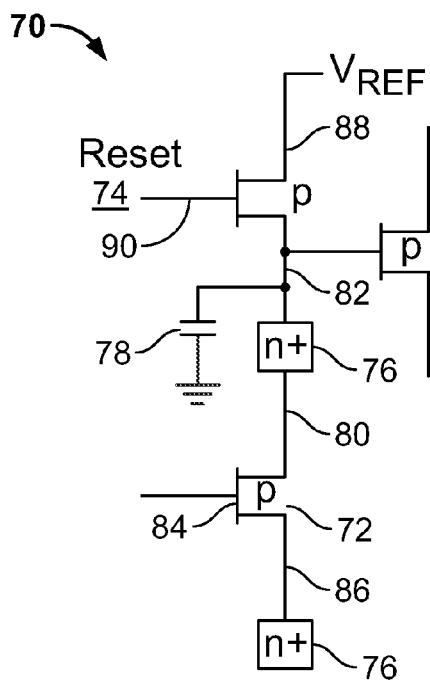
FIG. 11B is a corresponding circuit schematic diagram of FIG. 11A, according to an embodiment of the present invention.

The addition of an n+ source diffusion required by the MIM MOSFET 46 shown in FIG. 7A increases the sense node capacitance by approximately 1 fF. This in turn lowers sensitivity for the high gain state and increases read noise compared to a pixel without the MIM MOSFET 46. This problem may be circumvented by employing the MIM pixel layout 70 shown in FIG. 11A. FIG. 11A is a side view of a "series" MIM pixel layout 70 in the vicinity of a sense node 76 employing n-type transistors (NMOS pixel), according to an embodiment of the present invention. FIG. 11B is a corresponding circuit schematic diagram of FIG. 11A, according to an embodiment of the present invention. In FIGS. 11A and 11B, a MIM MOSFET 72 and a reset MOSFET 74 are placed in "series" and clocked together to reset the sense node 76.

More particularly, the "series" MIM pixel layout 70 includes a MIM capacitor 78, of which one terminal (i.e., the plates M2 and M4) is electrically connected to a common n+ region 80 which functions as both an n+ drain 82 of the MIM MOSFET 72 and an n+ source 82 of the reset MOSFET 74. A second terminal (i.e., the plate M3) of the MIM capacitor 78 is connected to ground potential. A MIM MOSFET gate 84 is located between the n+ drain 82 and an n+ source 86 of the MIM MOSFET 72. The n+ source 86 of the MIM MOSFET 72 functions as the sense node 76. An n+ drain 88 of the reset MOSFET 74 is located distal to the n+ source 82 of the reset MOSFET 74 with a gate 90 located therebetween. The n+ drain 88 of the reset MOSFET 74 is connected to positive potential (i.e., V$_{REF}$).

Figure 12:
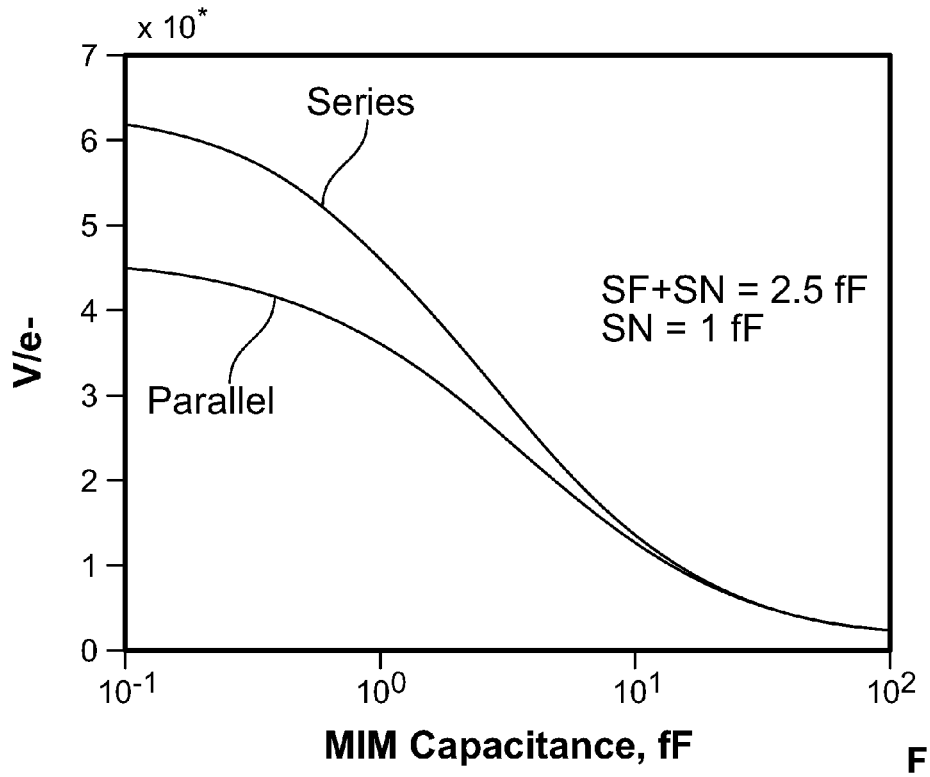
FIG. 12 plots V/e– as a function of MIM capacitance comparing the series and parallel arrangements assuming n+ diffusion and source follower gate capacitances of 1 and 1.5 fF respectively.

Following a reset, the MIM MOSFET 72 is either turned off (for high V/e−) or left on (for low V/e−). FIG. 12 plots V/e− as a function of MIM capacitance comparing the series and parallel arrangements assuming n+ diffusion and source follower gate capacitances of 1 and 1.5 fF respectively. Note the extra diffusion capacitance inherent with the parallel design significantly lowers sensitivity for the high gain state. It should be mentioned that the series arrangement requires a MIM driver for each row compared to a single driver used for the 'parallel' circuit in FIGS. 7A and 7B. The reset and MIM drivers may share the same drive voltages.

Figure 11C:
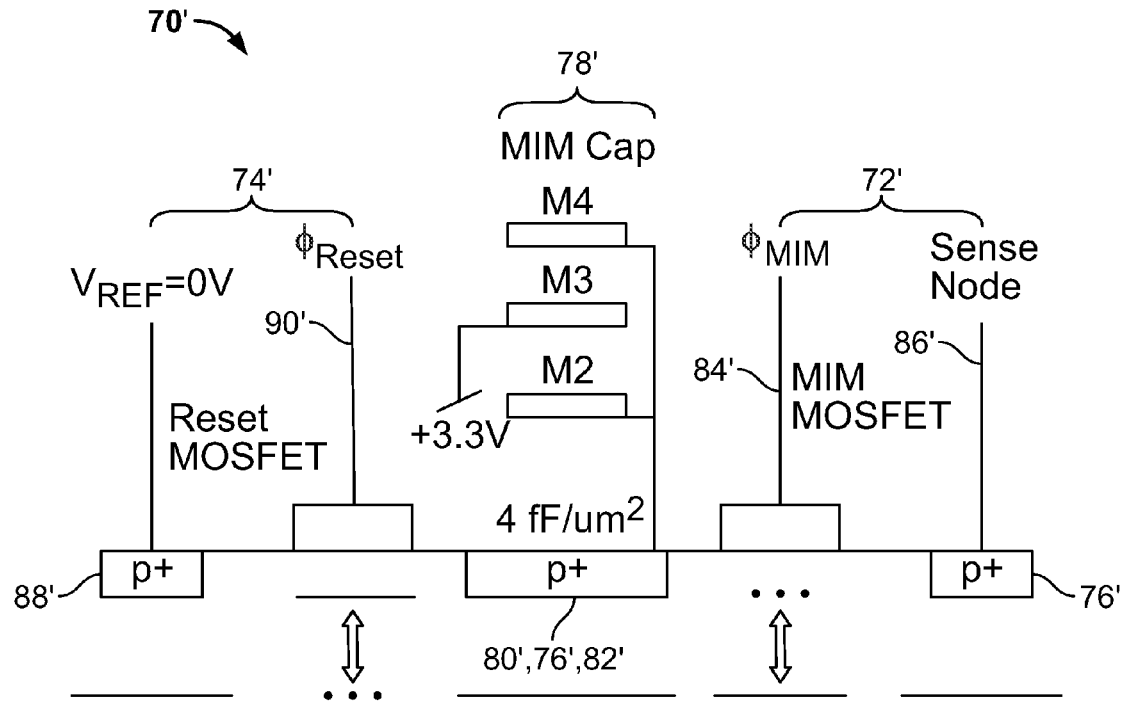
FIG. 11C is a side view of a "series" MIM pixel layout in the vicinity of a sense node employing p-type transistors (PMOS pixel), according to an embodiment of the present invention.
Figure 11D:
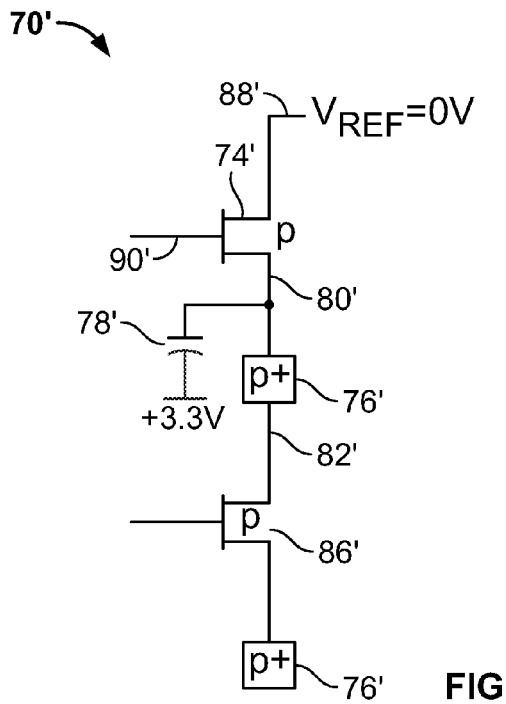
FIG. 11D is a corresponding circuit schematic diagram of FIG. 11C, according to an embodiment of the present invention.

FIG. 11C is a side view of a "series" MIM pixel layout 70' in the vicinity of a sense node 76' employing p-type transistors (PMOS pixel), according to an embodiment of the present invention. FIG. 11D is a corresponding circuit schematic diagram of FIG. 11C, according to an embodiment of the present invention. In FIGS. 11C and 11D, a MIM MOSFET 72' and a reset MOSFET 74' are placed in "series" and clocked together to reset the sense node 76'. More particularly, the "series" MIM pixel layout 70' includes a MIM capacitor 78', of which one terminal (i.e., the plates M2 and M4) is electrically connected to a common p+ region 80' which functions as both an p+ drain 82' of the MIM MOSFET 72' and an p+ source 80' of the reset MOSFET 74'. A second terminal (i.e., the plate M3) of the MIM capacitor 78' is connected to positive potential (+3.3V). A MIM MOSFET gate 84' is located between the p+ drain 82' and an p+ source 76' of the MIM MOSFET 72'. The p+ source 76' of the MIM MOSFET 72' functions as the sense node 76'. An p+ drain 88' of the reset MOSFET 74' is located distal to the p+ source 80' of the reset MOSFET 74' with a gate 90' located therebetween. The p+ drain 88' of the reset MOSFET 74' is connected to low potential (i.e., $V_{REF}$=0 V).

Figure 13A:
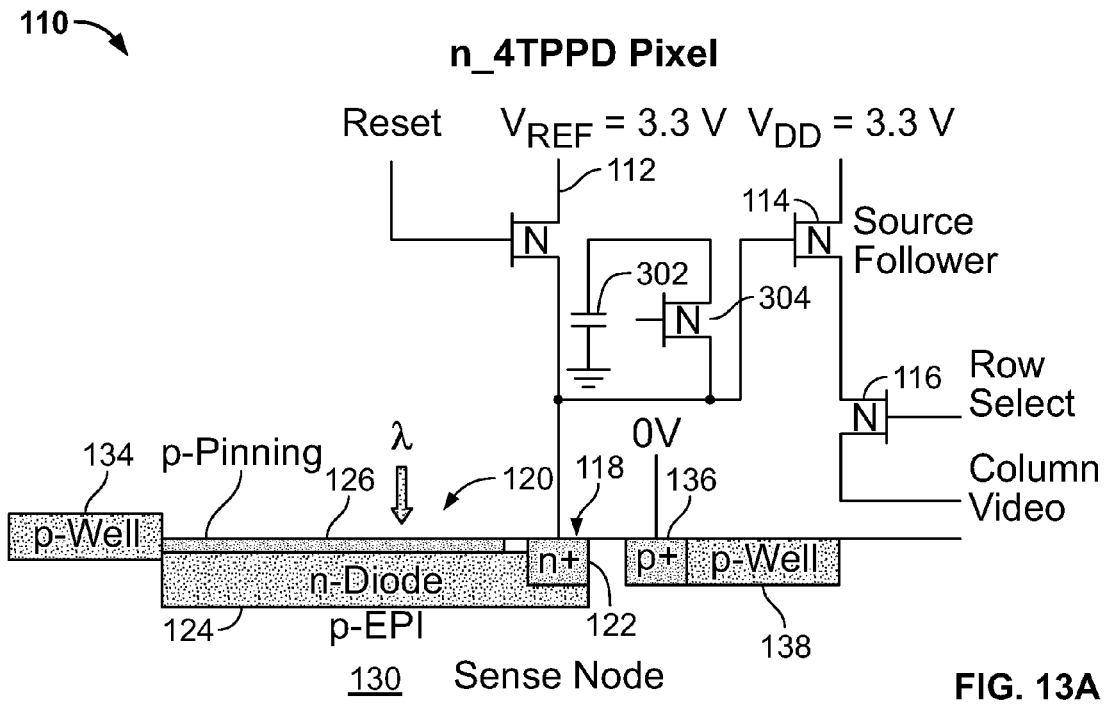
FIGS. 13A, 13B, and 13C are cross-sectional views of n-type CMOS 4T, 5T, and 6T pixels (NMOS pixels), each employing a MIM capacitor/MIM MOSFET in a "parallel" configuration, respectively, according to an embodiment of the present invention.
Figure 13B:
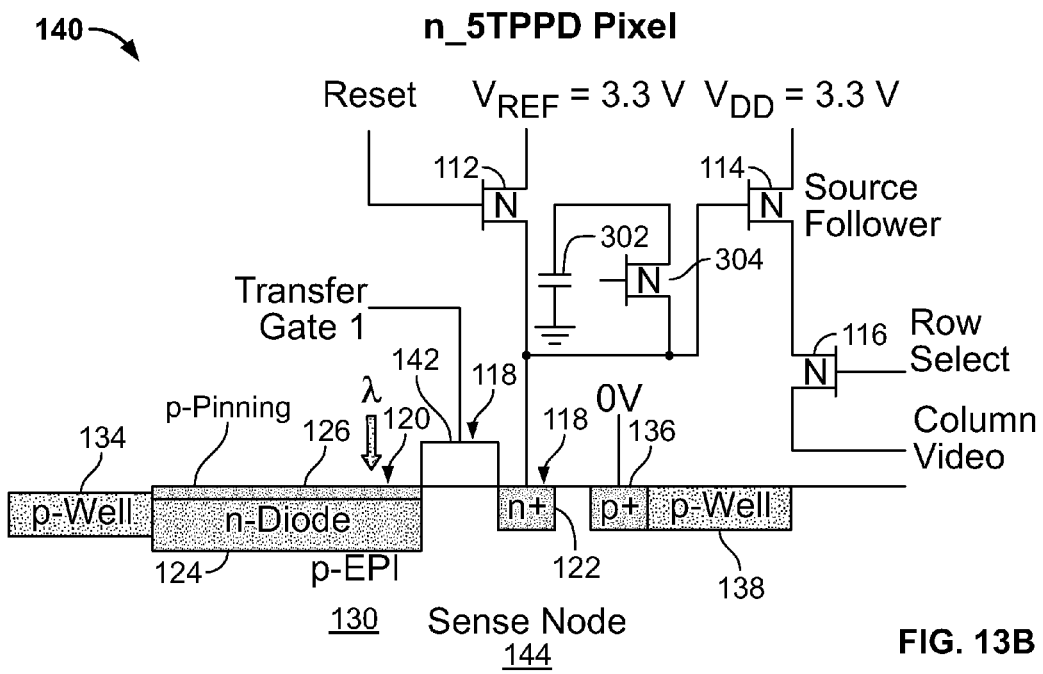
Figure 13C:
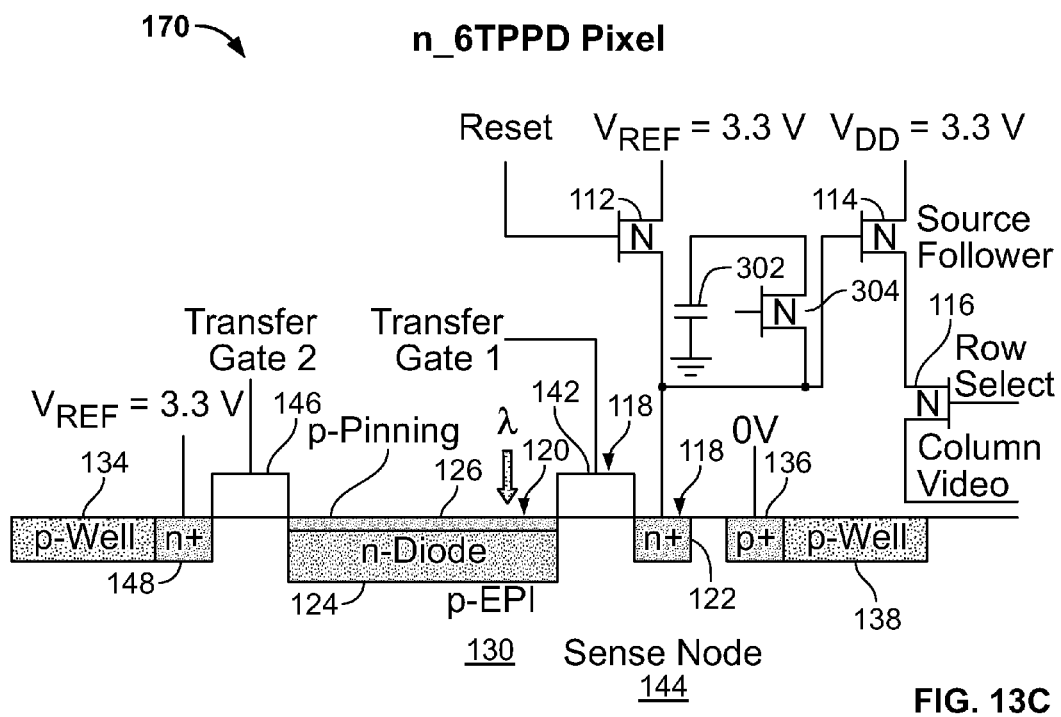
Figure 14A:
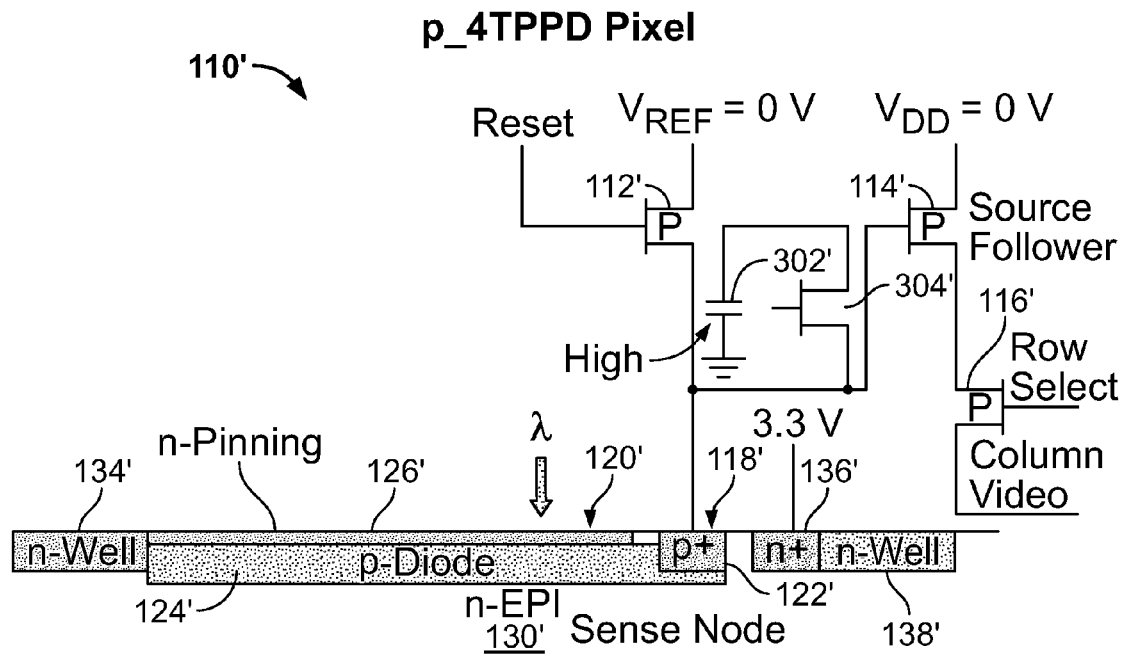
FIGS. 14A, 14B, and 14C are cross-sectional views of p-type CMOS 4T, 5T, and 6T pixels (PMOS pixels), each employing a MIM capacitor/MIM MOSFET in a "parallel" configuration, respectively, according to an embodiment of the present invention.
Figure 14B:
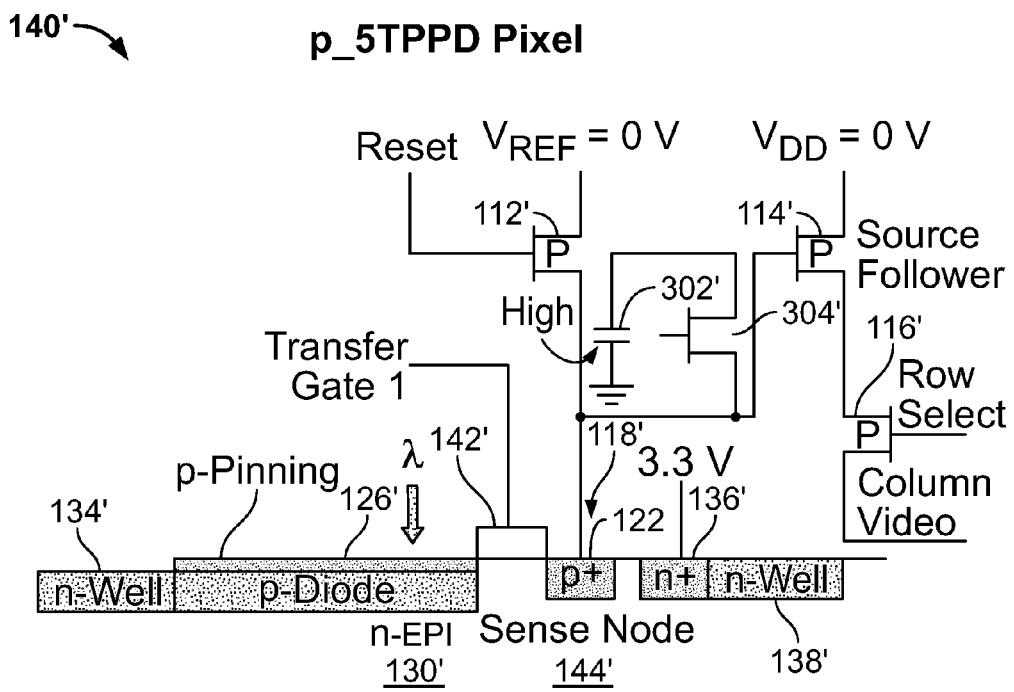
Figure 14C:
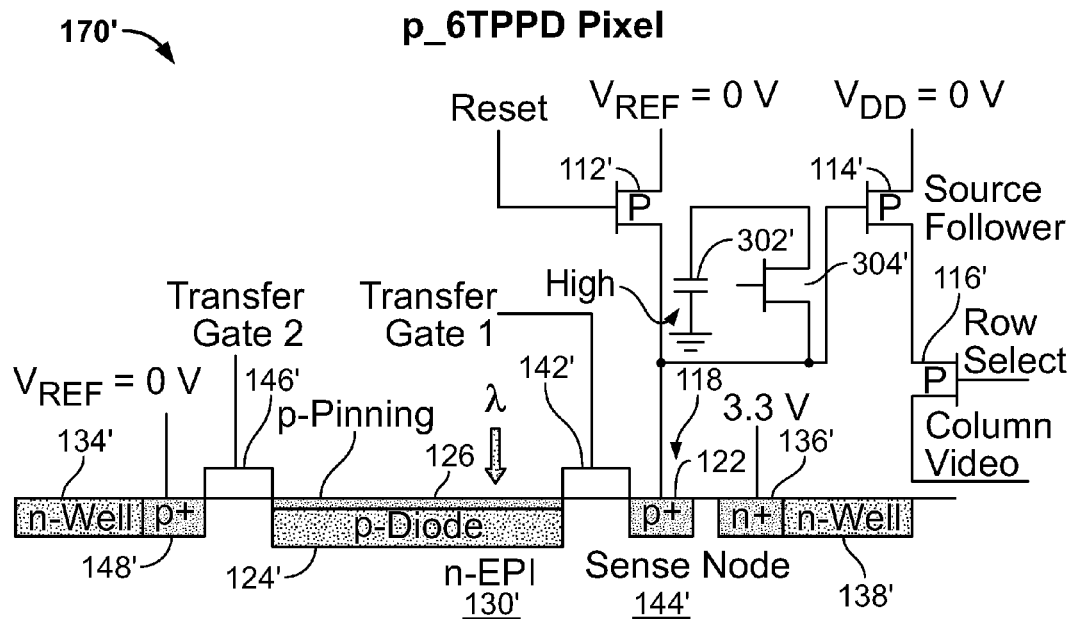

A person skilled in the art would appreciate that the MIM capacitor/MIM MOSFET configurations shown in FIGS. 7A and 11A may be connected within any suitable 3T, 4T and 5T n-type pixels to form n_4TTPD, n_5TPPD and n_6TPPD pixels without departing from the intent of embodiments of the present invention. Examples of n_4TPPD, n_5TPPD, and n_6TPPD pixels connected and illustrated schematically to "parallel" MIM capacitor/MIM MOSFET configurations are shown in FIGS. 13A-13C, respectively, according to certain embodiments of the present invention. Further, a person skilled in the art would appreciate that the conductivity type of the readout transistors, sense nodes, and the epi layer, and potential connections (e.g., ground and $V_{REF}$) may be reversed to form a corresponding p-type p_4TPPD, p_5TPPD and p_6TPPD pixels without departing from the intent of embodiments of the present invention. Examples of p_4TPPD, p_5TPPD, and p_6TPPD pixels connected and illustrated schematically to "parallel" MIM capacitor/MIM MOSFET configurations are shown in FIGS. 14A-14C, respectively, according to certain embodiments of the present invention.

FIGS. 13A, 13B, and 13C are cross-sectional views of an n-type CMOS 4T pixel (NMOS pixel for three-transistor pixel plus MIM MOSFET), 5T pixel (for 3-transistor plus 1-transfer gate pixel plus MIM MOSFET), and 6T pixel (for 3-transistor plus 2-transfer gate pixel plus MIM MOSFET), each employing a MIM capacitor/MIM MOSFET in a "parallel" configuration, according to an embodiment of the present invention. The CMOS pixels are hereinafter designated as n_4TPPD, n_5TPPD and n_6TPPD pixels, 110, 140, 170, respectively (collectively referred to as n_pixels).

The p_4TPPD pixel 110 (FIG. 13A) includes three NMOS transistors 112, 114, 116 corresponding to a reset transistor 112, a source follower transistor 114 and a row transistor 116. The reset transistor 112 is electrically connected to a sense node 118. The sense node 118 is formed of an n+ contact 122 and a pinned photodiode 120. The pinned photodiode 120 includes a thin p-type pinning layer 126 overlying a custom n-diode implant 124, that in turn, overlies and forms a depletion region with an p-epitaxial layer 130. An n-well 134' is formed adjacent the pinned photodiode 120 in the p-epitaxial layer 130 for isolating the n_4TPPD pixel 110 from neighboring pixels. A p+ return contact 136 is formed proximal to the other side of the pinned photodiode 120 and is held at "low" potential (about 0 V) for providing a return and reference for the n_4TPPD pixel. An n-well 138 is formed adjacent to the p+ return contact 136 for isolating the n_4TPPD pixel 110 from neighboring pixels.

The 5T pixel 140 (FIG. 13B), also known as a charge transfer pixel (designated hereinafter as an n_5TPPD pixel), is similar to the 4T pixel 110 (FIG. 13A) except that the 5T pixel 140 has a transfer gate 142 coupled between the reset transistor 112 and the pinned photodiode 120 so that a sense node 144 may be created between the transfer gate 142 and the reset transistor 112. The sense node 144 may be isolated from the pinned photodiode 120. An n+ contact 148 is formed adjacent to the second transfer gate 146 distal to the pinned photodiode 120' and is tied to $V_{REF}$ (about +3.3 volts). As a result, charge may be transferred from a photodetection region to the sense node 144 when a "logical 1" or "high" potential of about 3.3 V is applied to the input TRANSFER GATE 1, where a resulting voltage is read out by the source follower transistor 114.

The 6T pixel 170 (FIG. 13C) is similar to the n_5TPPD pixel, but includes a second transfer gate 146 abutting the side of the pinned photodiode 120 distal to the transfer gate 142. An n+ contact 148 is formed adjacent to the second transfer gate 146 distal to the pinned photodiode 120 and is tied to $V_{REF}$ (about +3.3 volts). The second transfer gate 146 may be used as a global reset for the imager and as an antiblooming gate for preventing excess charge generated in the photodiode 120 from "blooming" through the transfer gate 142 to the sense node 144 when a voltage is applied to the input TRANSFER GATE 2 that is more positive than the transfer gate-to-sense node voltage.

In each of FIGS. 13A-13C, a MIM capacitor 302 is configured to be switched onto the sense node 118, 144 via a an n-type MIM MOSFET 304 to increase signal gain. One terminal of the MIM capacitor 302 is electrically connected to the n-type MIM MOSFET 304 at a drain terminal. A second terminal of the MIM capacitor 302 is connected to low potential (e.g, about 0 V). The source terminal of the n-type MIM MOSFET 304 is connected to the source terminal of a reset transistor 112.

FIGS. 14A, 14B, and 14C are cross-sectional views of a p-type CMOS 4T pixel (PMOS pixel for three-transistor pixel plus MIM MOSFET), 5T p-type pixel (for 3-transistor plus 1-transfer gate pixel MIM MOSFET), and 6T p-type pixel (for 3-transistor plus 2-transfer gate pixel MIM MOSFET) each employing a MIM capacitor/MIM MOSFET in a "parallel" configuration, respectively, according to an embodiment of the present invention. The CMOS pixels are hereinafter designated as p_4TPPD, p_5TPPD and p_6TPPD pixels, 110', 140', respectively (collectively referred to as p_pixels). The p_4TPPD pixel 110' includes three PMOS transistors 112', 114', 116' standing for a reset transistor 112', a source follower transistor 114' and a row transistor 116'. The reset transistor 112' is electrically connected to a sense node 118'. The sense node 118' is formed of a p+ contact 122' and a pinned photodiode 120'. The pinned photodiode 120' includes a thin n-type pinning layer 126' overlying a custom p-diode implant 124', that in turn, overlies and forms a depletion region with an n-epitaxial layer 130'. An n-well 134' is formed adjacent the pinned photodiode 120' in the n-epitaxial layer 130' for isolating the p_4TPPD pixel 110' from neighboring pixels. An n+ return contact 136' is formed proximal to the other side of the pinned photodiode 120' and is held at "high" potential (about +3.3V) for providing a return and reference for the p_4TPPD pixel. An n-well 138' is formed adjacent to the p+ return contact 136'.

The 5T pixel 140' (FIG. 14B), also known as a charge transfer pixel (designated hereinafter as a p_5TPPD pixel), is similar to the 4T pixel 110' (FIG. 14A) except that the 5T pixel 140' has a transfer gate 142' coupled between the reset transistor 112' and the pinned photodiode 120' so that a sense node 144' may be created between the transfer gate 142' and the reset transistor 112'. The sense node 144' may be isolated from the pinned photodiode 120'. As a result, charge may be transferred from a photodetection region to the sense node 144' when a "logical 0" or "low" ground potential of about 0V is applied to the input TRANSFER GATE 1, where a resulting voltage is read out by the source follower transistor 114'.

The 6T pixel 170' (FIG. 14C) is similar to the p_5TPPD pixel, but includes a second transfer gate 146' abutting the side of the pinned photodiode 120' distal to the transfer gate 142'. A p+ contact 148' is formed adjacent to the second transfer gate 146' distal to the pinned photodiode 120' and is tied to $V_{REF}$ (about 0 volts). The second transfer gate 146' may be used as a global reset for the imager and as an antiblooming gate for preventing excess charge generated in the photodiode 120' from "blooming" through the transfer gate 142' to the sense node 144' when a voltage is applied to the input TRANSFER GATE 2 that is more negative than the transfer gate-to-sense node voltage.

In each of FIGS. 14A-14C, a MIM capacitor 302' is configured to be switched onto the sense node 118', 144' via a p-type MIM MOSFET 304' to increase signal gain. One terminal of the MIM capacitor 302' is electrically connected to the p-type MIM MOSFET 304' at a drain terminal. A second terminal of the MIM capacitor 302' is connected to high potential (e.g, about +3.3V). The source terminal of the p-type MIM MOSFET 304' is connected to the source terminal of the reset transistor 112' which is also electrically connected to the sense node 118', 144'.

The 6T pixel 170 (FIG. 13C) is similar to the n_5TPPD pixel, but includes a second transfer gate 146 abutting the side of the pinned photodiode 120 distal to the transfer gate 142. An n+ contact 148 is formed adjacent to the second transfer gate 146 distal to the pinned photodiode 120 and is tied to $V_{REF}$ (about +3.3 volts). The second transfer gate 146 may be used as a global reset for the imager and as an antiblooming gate for preventing excess charge generated in the photodiode 120 from "blooming" through the transfer gate 142 to the sense node 144 when a voltage is applied to the input TRANSFER GATE 2 that is more positive than the transfer gate-to-sense node voltage.

Figure 15A:
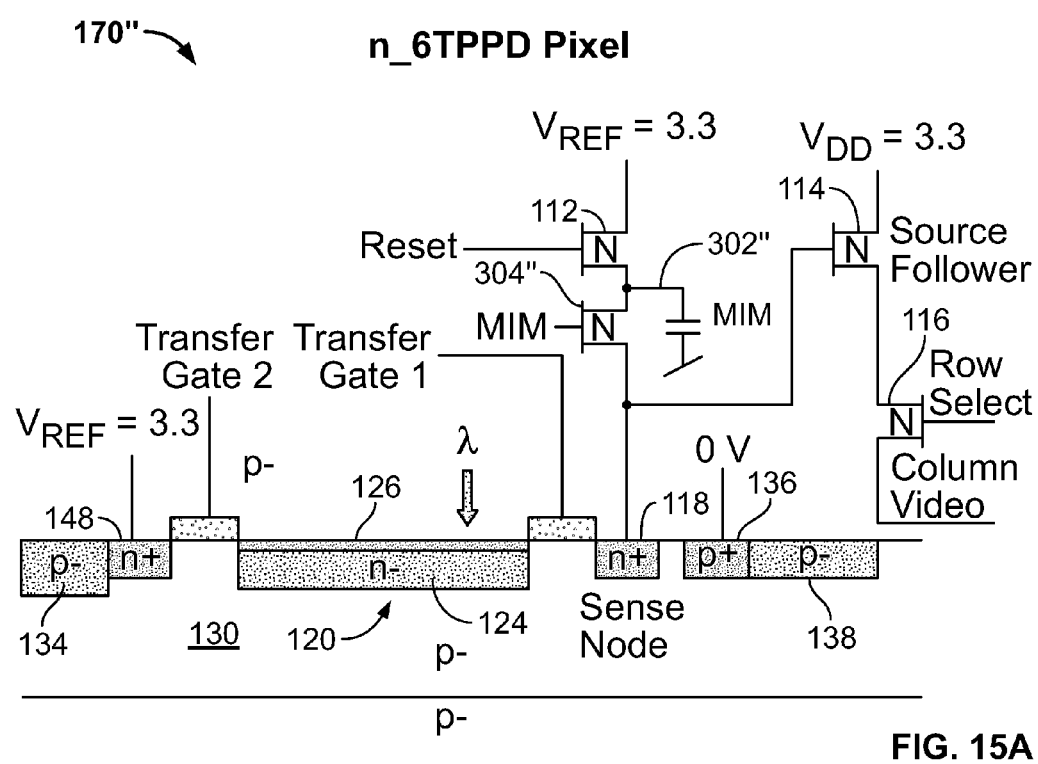
FIG. 15A is a cross-sectional views of an n-type CMOS 6T pixel (NMOS pixel), substantially identical to the 6T pixel of FIG. 13C, except that the MIM capacitor/MIM MOSFET is connected in a series configuration discussed above in connection with FIG. 11B, according to an embodiment of the present invention.
Figure 15B:
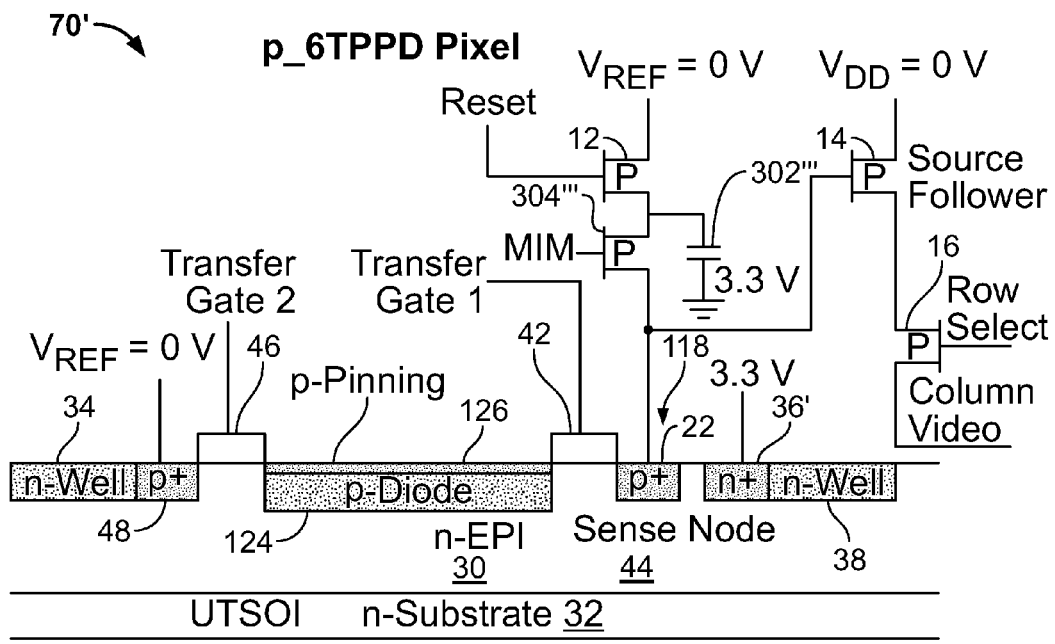
FIG. 15B is a cross-sectional views of an p-type CMOS 6T pixel (PMOS pixel), substantially identical to the 6T pixel of FIG. 14C, except that the MIM capacitor/MIM MOSFET is connected in a series configuration discussed above in connection with FIG. 11D, and the pixel is built upon a UTSOI n-type substrate, according to an embodiment of the present invention.

FIG. 15A is a cross-sectional views of an n-type CMOS 6T pixel (i.e., an n_6TPPD or PMOS pixel), substantially identical to the 6T pixel of FIG. 14C, except that the MIM capacitor 302"/MIM MOSFET 304" is connected in a series configuration discussed above in connection with FIG. 11B, according to an embodiment of the present invention. FIG. 15B is a cross-sectional views of an p-type CMOS 6T pixel (i.e., a p_6TPPD), substantially identical to the 6T pixel of FIG. 13C, except that the MIM capacitor 302'''/MIM MOSFET 304''' is connected in a series configuration discussed above in connection with FIG. 11D, according to an embodiment of the present invention. The 6T pixel is built upon a ultra-thin silicon-on-insulator (UTSOI) n-type substrate. A person of ordinary skill in the art would appreciate that the 6T pixel may be implemented on a UTSOI substrate where the 6T pixel may be of either n (NMOS) type or p (PMOS) type built upon a buried oxide layer and overlying a handle wafer wherein the handle wafer may be either n type or p type.

Referring now to FIG. 15A, The MIM MOSFET 304" is connected in "series" with the reset transistor 112. One terminal of the MIM capacitor 302" is electrically connected to the drain terminal of the n-type MOSFET 304". A second terminal of the MIM capacitor 302" is connected to low potential (e.g., about 0 V). The drain terminal of the n-type MOSFET 304" is connected to the source terminal of the reset transistor 112. The source terminal of the MIM MOSFET 304" is electrically connected to the sense node 118, 144 and the gate terminal of the source follower transistor 114.

Referring now to FIG. 15B, The MIM MOSFET 304''' is connected in "series" with the reset transistor 112. One terminal of the MIM capacitor 302''' is electrically connected to the drain terminal of the p-type MOSFET 304'''. A second terminal of the MIM capacitor 302''' is connected to high potential (e.g., about +3.3 V). The drain terminal of the p-type MOSFET 304''' is connected to the source terminal of the reset transistor 112. The source terminal of the MIM MOSFET 304 is electrically connected to the sense node 118, 144 and the gate terminal of the source follower transistor 114.

A person skilled in the art would recognize that n_4PPD, n_5PPD, p_4TPPD, and p_5TPPD pixels may be constructed with series MIM capacitor/MIM MOSFET configurations similar to that of FIGS. 15A and 15B pixels without departing from the intent of embodiments of the present invention.

In addition to PPDs, which naturally operate as a buried channel structures for 3-5TPPD pixels, buried channels may also be applied to readout and other MOSFET transistors in CMOS imagers, according to an embodiment of the present invention.

Figure 16:
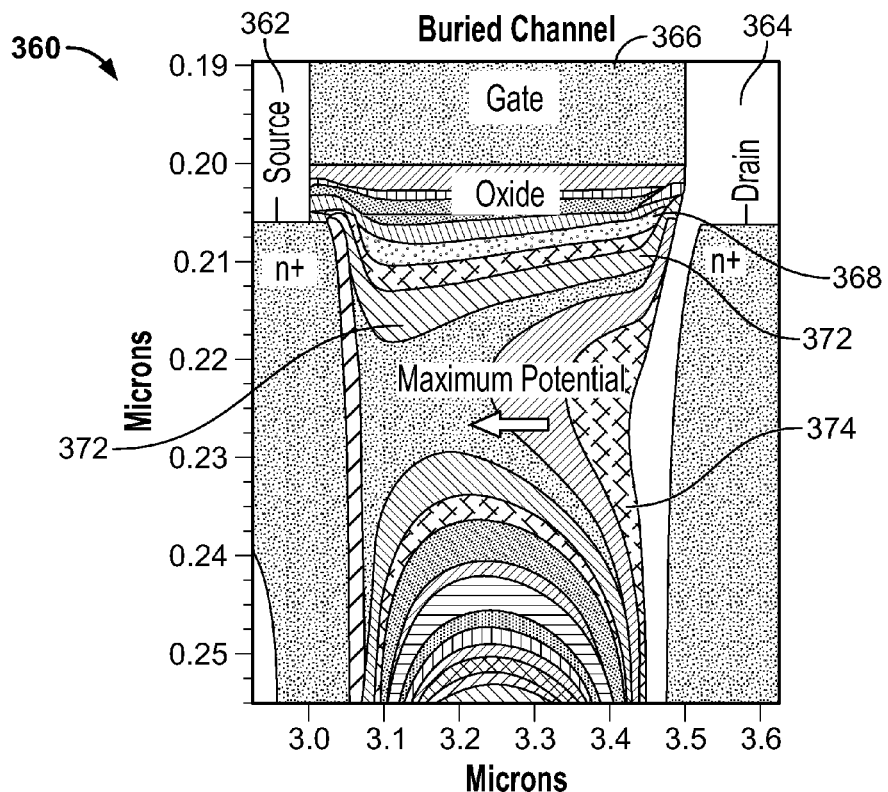
FIG. 16 presents a cross-section of a buried channel MOSFET which adds a buried channel implant to the source follower in the pixel to improve readout noise, according to an embodiment of the present invention.

FIG. 16 is a cross-section of a buried channel MOSFET 360 which adds a buried channel implant to the source follower in the pixel to improve readout noise, according to an embodiment of the present invention. The buried channel MOSFET 360 includes source 362, drain 364, gate 366, oxide 368, and buried channel 370 regions. The equal potential contours depicted within the buried channel regions 370 of FIG. 16 show that the maximum potential shifts approximately 0.02 um below the surface 372 forcing drain current to flow in the bulk 374. In doing so, RTS noise decreases since less drain current interacts at the surface 372. Also, the modulation strength of traps at the surface 372 is less influential on bulk carriers. The Coulomb force around a trap extends approximately 0.02 μm, the same as the depth of the buried channel 370.

Figure 17A:
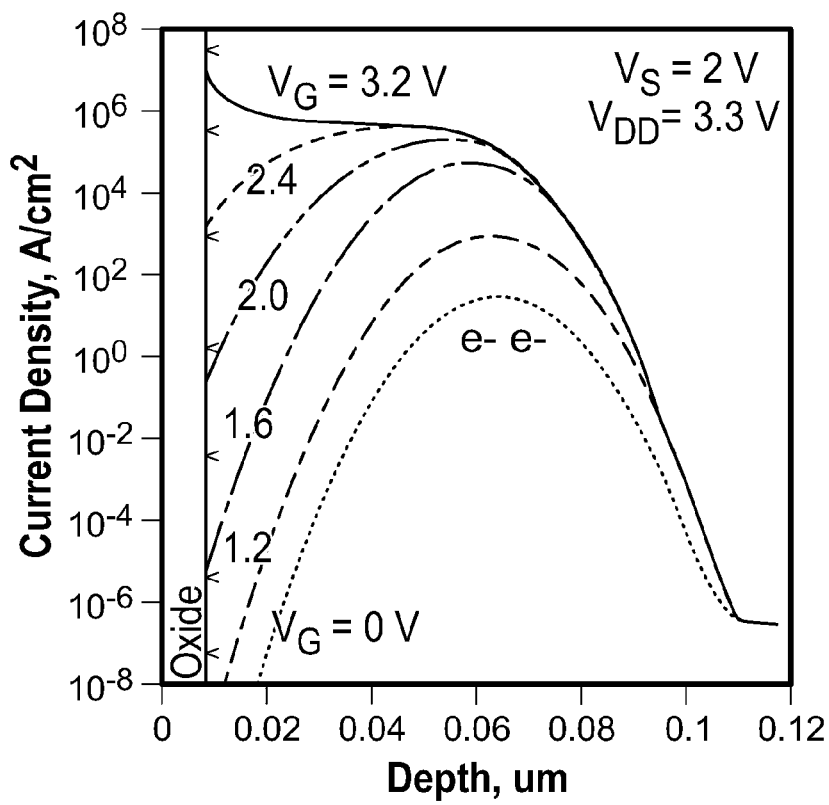
FIG. 17A plots the current density with depth for the buried channel MOSFET of FIG. 16.
Figure 17B:
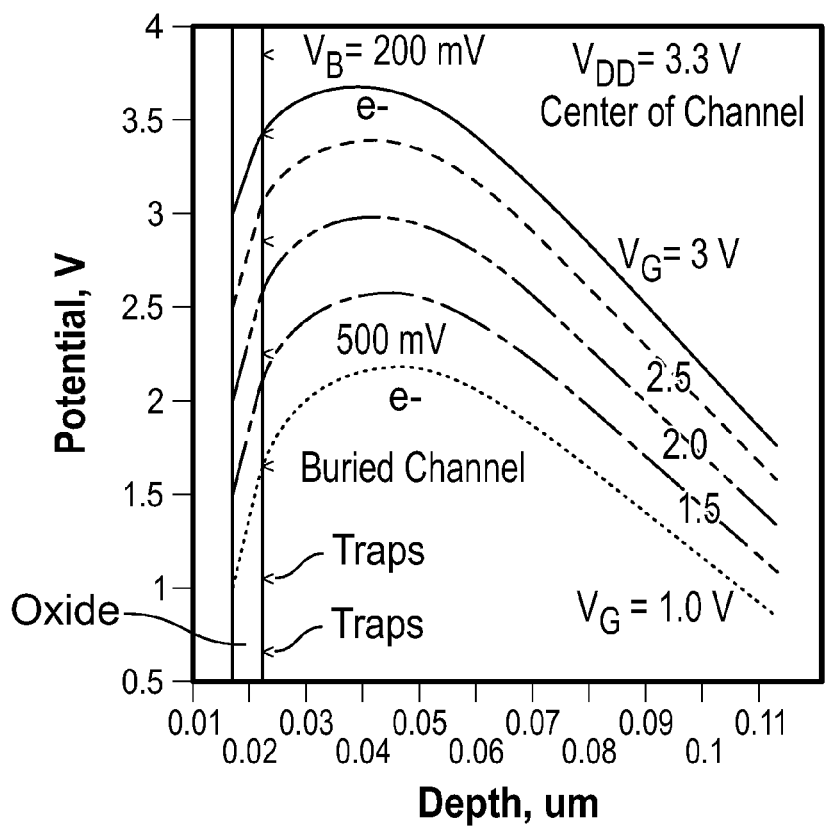
FIG. 17B plots channel potential with depth for the buried channel MOSFET of FIG. 16.

FIG. 17A plots the current density (A/cm$^2$) with depth for a buried channel MOSFET 360 of FIG. 16. Note that drain current flows in the bulk 374 at a low gate voltage (or high signal level). However, for a high gate voltage (or low signal level), drain current begins to interact more with the surface 372. This condition is not desirable because low signal measurement requires low RTS noise. FIG. 17B plots channel potential with depth for the buried channel MOSFET 360 of FIG. 16, showing that a gate voltage of 1.0 V produces a thermal barrier of 500 mV, which prevents carriers from interacting with the surface 372. Increasing the gate bias to 3 V lowers the barrier to 200 mV, which is somewhat marginal for surface isolation (at least 10 kT is required for a good surface barrier). Therefore, for efficient MOSFET buried channel operation, it is important that gate bias is adjusted carefully until there is a sufficient surface barrier for low RTS noise while maintaining high dynamic range.

Figure 18A:
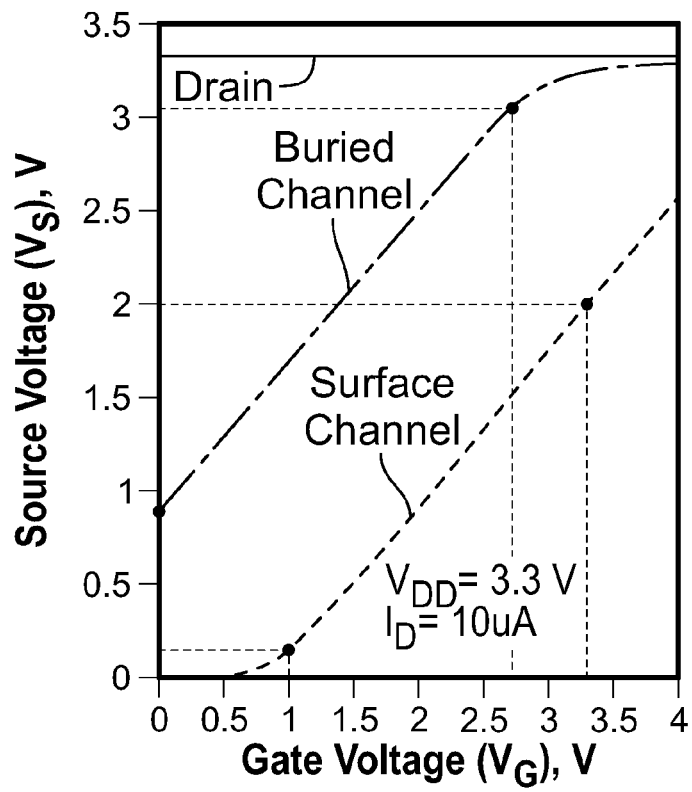
FIG. 18A presents buried channel and surface channel MOSFET transfer characteristics relating the gate ($V_G$), drain ($V_{DD}$) and source ($V_S$) voltages.
Figure 18B:
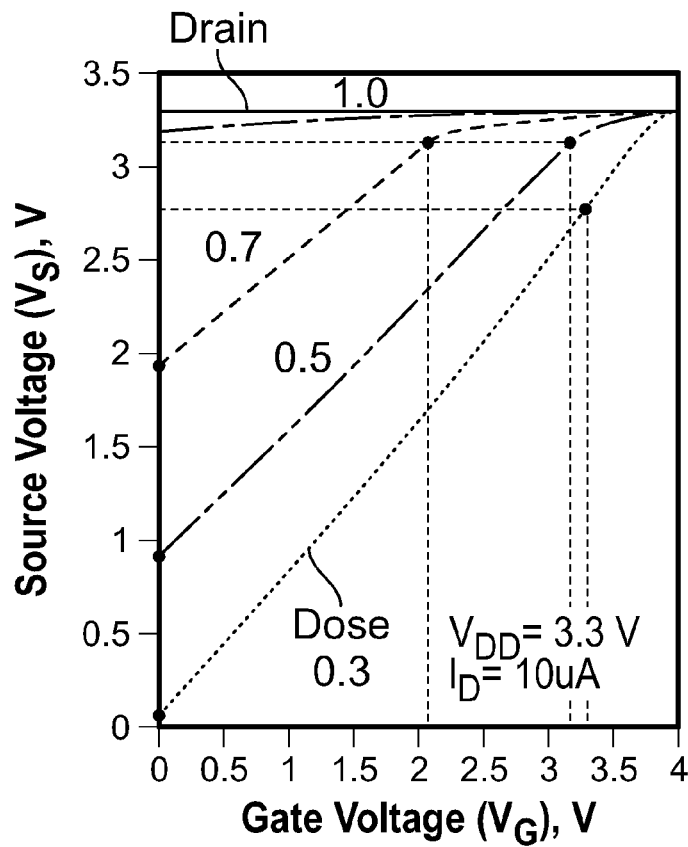
FIG. 18B shows how the threshold shifts with buried channel implant dose.

FIG. 18A presents buried channel MOSFET transfer characteristics relating the gate ($V_G$), drain ($V_{DD}$) and source ($V_S$) voltages. For comparison, a surface channel MOSFET transfer characteristic without buried channel implant is also shown. Note that the linear range for the surface device is between $V_S=0.2/V_G=1.0V$ to $V_S=2/V_G=3.3$ V for an overall dynamic range of 1.8 V at the source. For the buried channel device, operation is from $V_S=0.9/V_G=0V$ to $V_S=3.1/V_G=2.7$ V for a range of 2.2 V. Note that a surface channel device exhibits V/V nonlinearity near full well as the source voltage approaches ground potential. In contrast, a buried channel device shows non linearity for low signal levels unless $V_G$ is lowered from 3.3 V by adjusting $V_{REF}$. FIG. 18B shows how the threshold shifts with buried channel implant dose (here maximum dose is normalized to unity). To stay linear, gate voltage should be reduced as dose increases. For extreme doses, dynamic range decreases dramatically. Hence, buried channel optimization needs to consider tradeoffs between surface barrier height, nonlinearity and dynamic range.

Figure 19A:
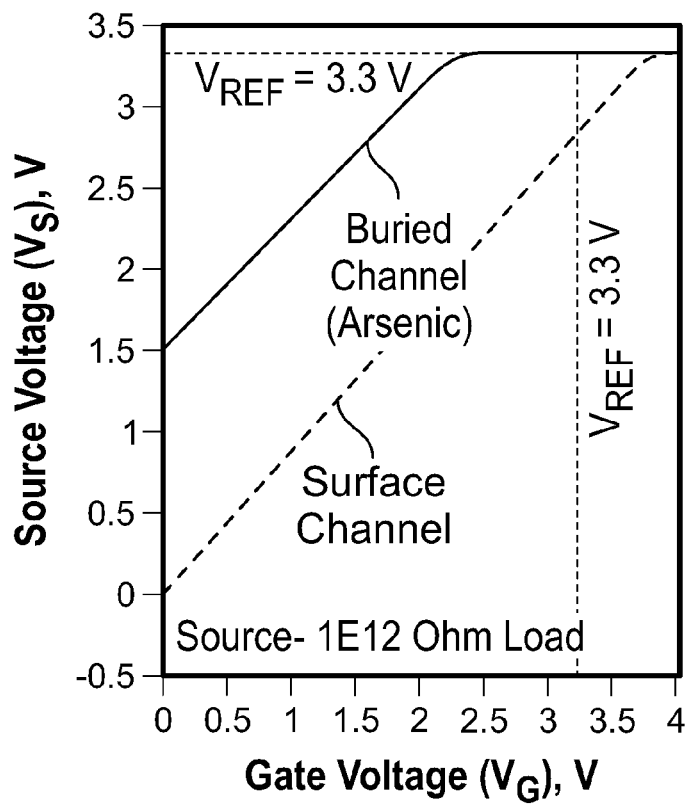
FIG. 19A shows sense node responses for both buried channel and surface channel reset MOSFETs.
Figure 19B:
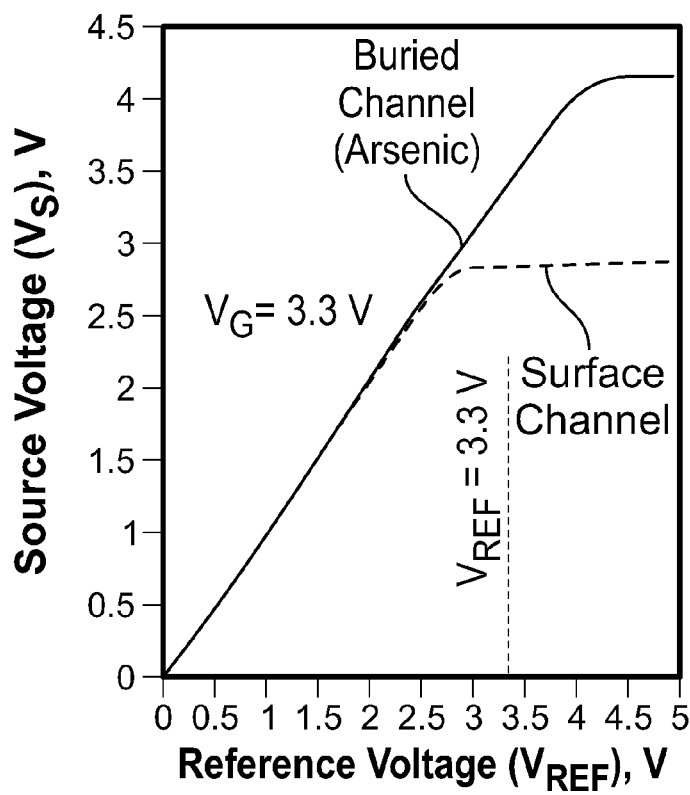
FIG. 19B plots the source voltage as a function of $V_{REF}$ with the gate voltage fixed at 3.3 V for surface and buried channel MOSFETs.

A buried channel may be used in a pixel's reset transistor, according to an embodiment of the present invention. A standard p-well reset transistor is problematic because a gate drive voltage must be driven 'hard' enough to over come a MOSFET's threshold in taking the source (or sense node) to its drain voltage. Overdriving the reset MOSFET introduces unnecessary reset clock feed through which reduces dynamic range. This problem is particularly applicable to high V/e– pixels when high reset clock feedthrough is present. FIG. 19A shows sense node responses for both buried channel and surface channel reset MOSFETs. Note that the surface channel reset MOSFET requires reset clock drive of 4 V to achieve 'hard reset' whereas the buried channel reset MOSFET only requires 2.5 V drive. FIG. 19B plots the source voltage as a function of $V_{REF}$ with the gate voltage fixed at 3.3 V. The buried channel allows the sense node to reach 4.0 V whereas the surface channel is limited to 2.8 V. $V_{REF}$ is often adjusted for optimum performance while keeping the drain voltage of the source follower amplifier fixed ($V_{DD}=3.3$ or 5V depending on the fabrication process employed).

Certain embodiments of the present invention pertain to CMOS imagers that produce low noise and have a high dynamic range by employing a single analog-to-digital converter (ADC) per column with each pixel in the column employing a MIM capacitor/MINI MOSFET that switches between an off and on state to be described hereinbelow.

Figure 20:
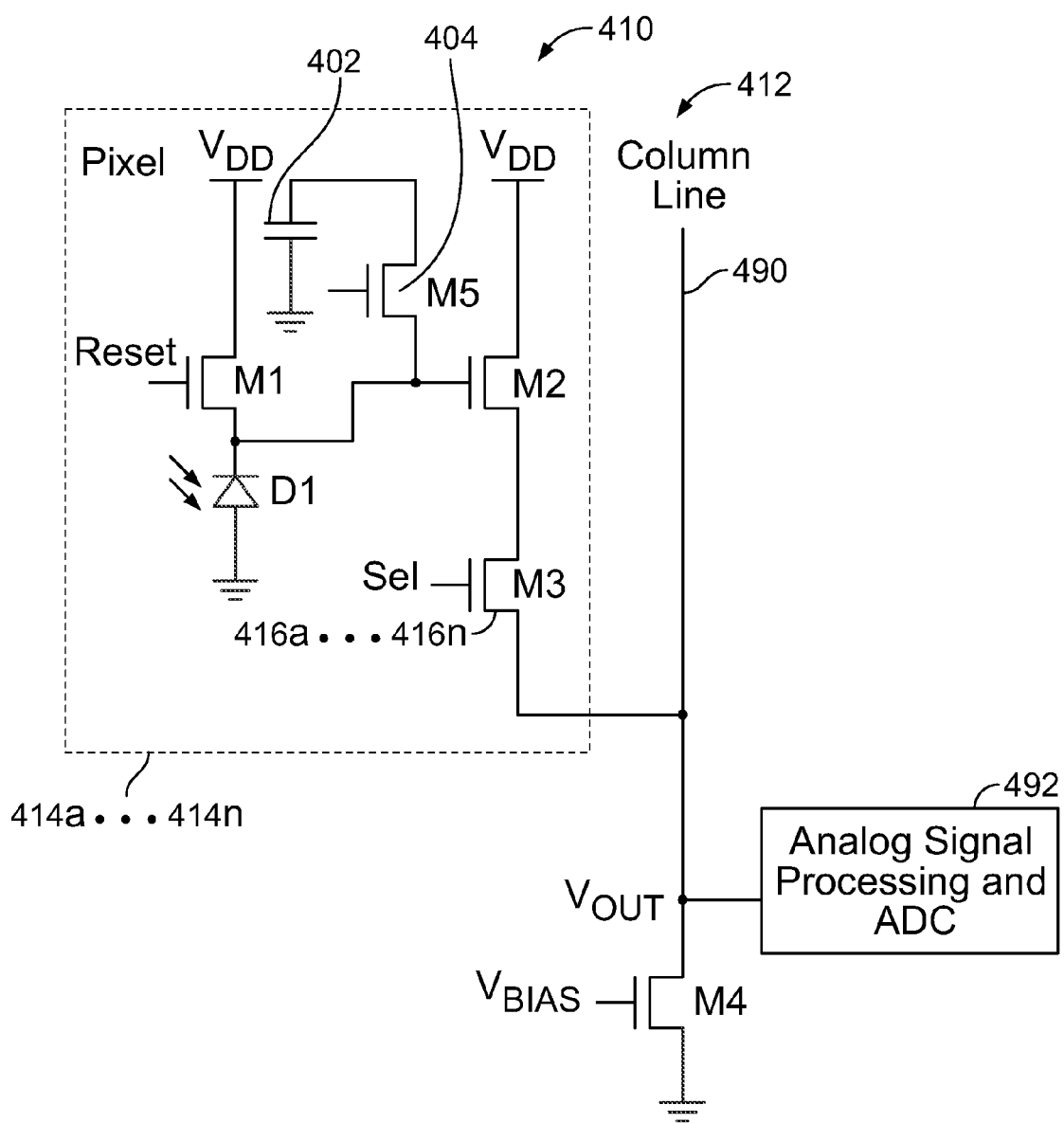
FIG. 20 is a schematic block diagram depicting an output interface for the 4T-6T pixel active readout circuitry of FIGS. 13A-13C employing a MIM capacitor/MIM MOSFET in a parallel configuration, according to an embodiment of the present invention.

FIG. 20 is a schematic block diagram depicting an output interface for the 4T-6T pixel active readout circuitry of FIGS. 13A-13C employing a MIM capacitor 402/MIM MOSFET 404 in a parallel configuration, according to an embodiment of the present invention. The CMOS imager 410 comprises a column 412 of pixels 414a-414n. Each of the pixels 414a-414n is coupled to the column 412 via a corresponding one of a plurality of row select transistors 416a-416n. An output voltage present on one of the pixels 414a-414n, puts its signal voltage on the column line 490 when its corresponding row select transistor M3 is activated. The MOSFET M4 is used to set a bias current for the column line 490. The signal voltage on the column line 490 then passes through analog signal processing circuits 492, which may include an optional amplifier, an optional analog correlated double sampling circuit (aCDS) to be described hereinbelow, and an analog-to-digital converter (ADC) circuit.

For the embodiment of FIG. 20, a high front end gain may be effected by placing the MIM capacitor 402/MIM MOSFET 404 in an "off" state (i.e., the MIM MOSFET 404 is open) required for a low digitized noise floor, but may saturate the input of the ADC of the analog signal processing circuits 492 at an undesirably low charge signal, resulting in clipped high light signals. To permit high light gray scale to be resolved, the MIM capacitor 402/MIM MOSFET 404 is configured to have a reduced gain characteristic as a signal on its input increases so as not to saturate the ADC by the placing MIM capacitor 402/MIM MOSFET 404 in an "on" state (i.e., the MIM MOSFET 404 is closed/operated). As a result, the input voltage to the ADC is compressed at higher light levels such that the slope of the transfer function of DN/volt (digital number/volt) at the output of the ADC decreases.

CMOS imagers, unlike to CCD imagers, are susceptible to fixed pattern noise (FPN). In a CCD imager, charge is transferred between neighboring CCD elements with a high charge transfer efficiency. The amount of the charge collected by a pixel in a CCD imager is also not heavily dependent on the parameters of the device. However, in a CMOS imager, the charge collected from a pixel passes through the CMOS readout transistors previously described in FIG. 21 (e.g., the reset M1, source follower M2, row select M3, and MIM MOSFET 404 transistors), which, in addition to adding some systematic nonlinearity, have a high degree of mismatch.

According to an embodiment of the present invention, FPN may be cancelled/reduced by on-chip or off-chip storage of offset values, obtained by reading the output of the readout transistors while they are reset. This method, however, requires a large amount of memory for storing the offset information for every pixel in a CMOS imager. Alternatively, a correlated double sampling technique may be employed. As used herein, correlated double sampling (CDS) refers to a technique for measuring electrical values such as voltages or currents that allows for removal of an undesired offset. It is used quite frequently when measuring sensor outputs. The output of a sensor is measured twice: once in a known condition and once in an unknown condition. The value measured from the known condition is then subtracted from the unknown condition to generate a value with a known relation to the physical quantity being measured.

Figure 21:
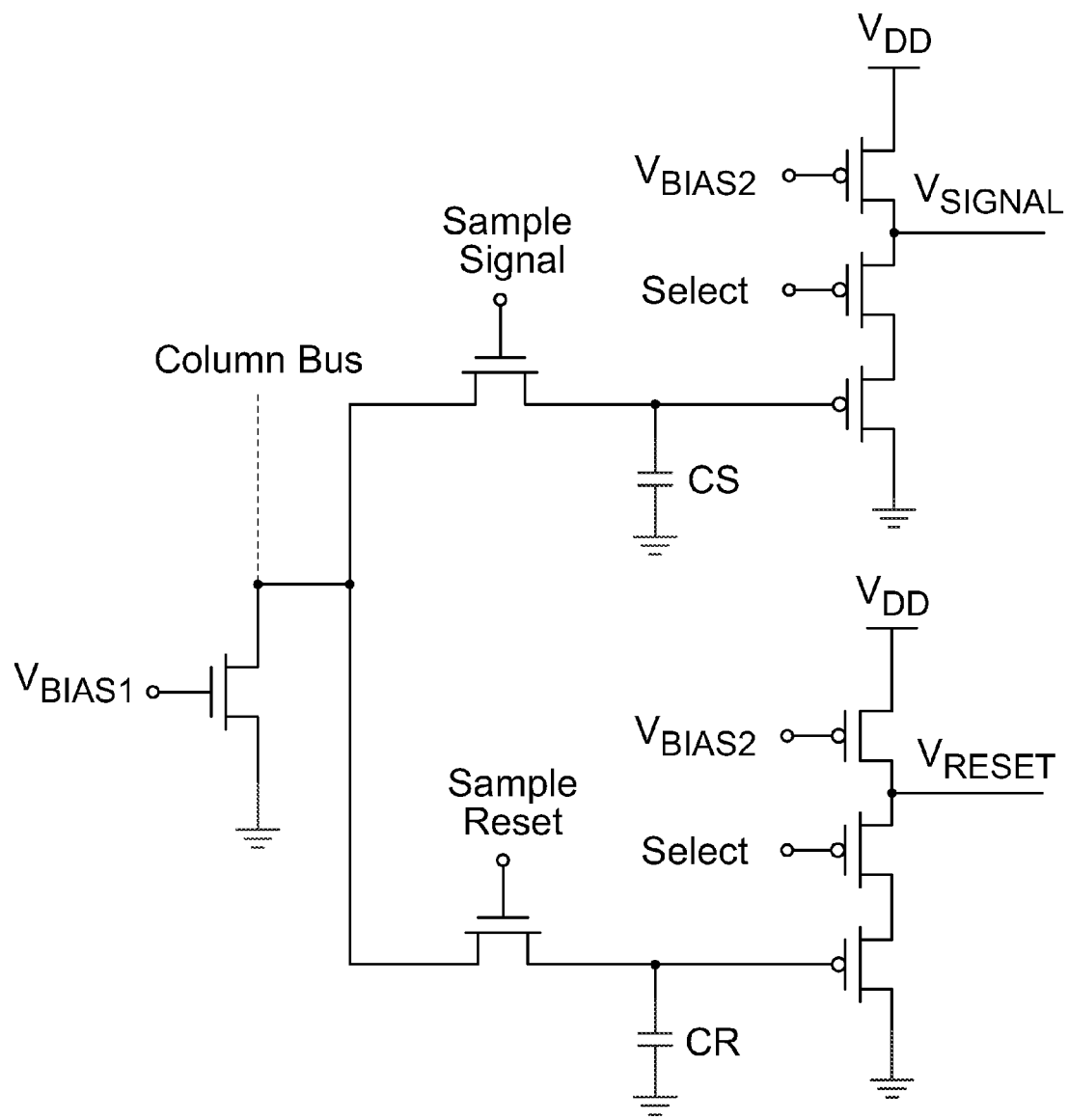
FIG. 21 is a circuit schematic of a conventional analog correlated double sampling circuit (aCDS) for use with the 4T-6T pixels of FIG. 20.

When the sensor is a CMOS pixel, one sample is taken when the pixel is still in the reset state, and one when the charge has been transferred to the read-out node. The two values are then used as differential signals in further stages. A conventional analog CDS circuit (aCDS) for use with the 4T-6T pixels of FIG. 20 is shown in FIG. 21. Alternatively, samples are directly sent to a computer and differenced there, in a technique called digital correlated double sampling (dCDS).

Deciding between dCDS or aCDS processing depends on the CMOS readout mode employed. For example, dCDS is preferable to read conventional 3T CMOS pixels to achieve very low noise. Conventional 5T CMOS pixels that read progressively (or rolling shutter) typically use an aCDS circuit, whereas for SNAP readout, it is preferable to employ dCDS for low noise. For conventional CMOS pixels, an aCDS signal chain delivers the lowest read noise possible because the sample-to-sample time and bandwidth are optimally selected by the user. In contrast, dCDS processing does not deliver ideal noise performance because the sample-to-sample time is forced by the frame and integration times required (which can amount to hours for some applications).

Figure 22:
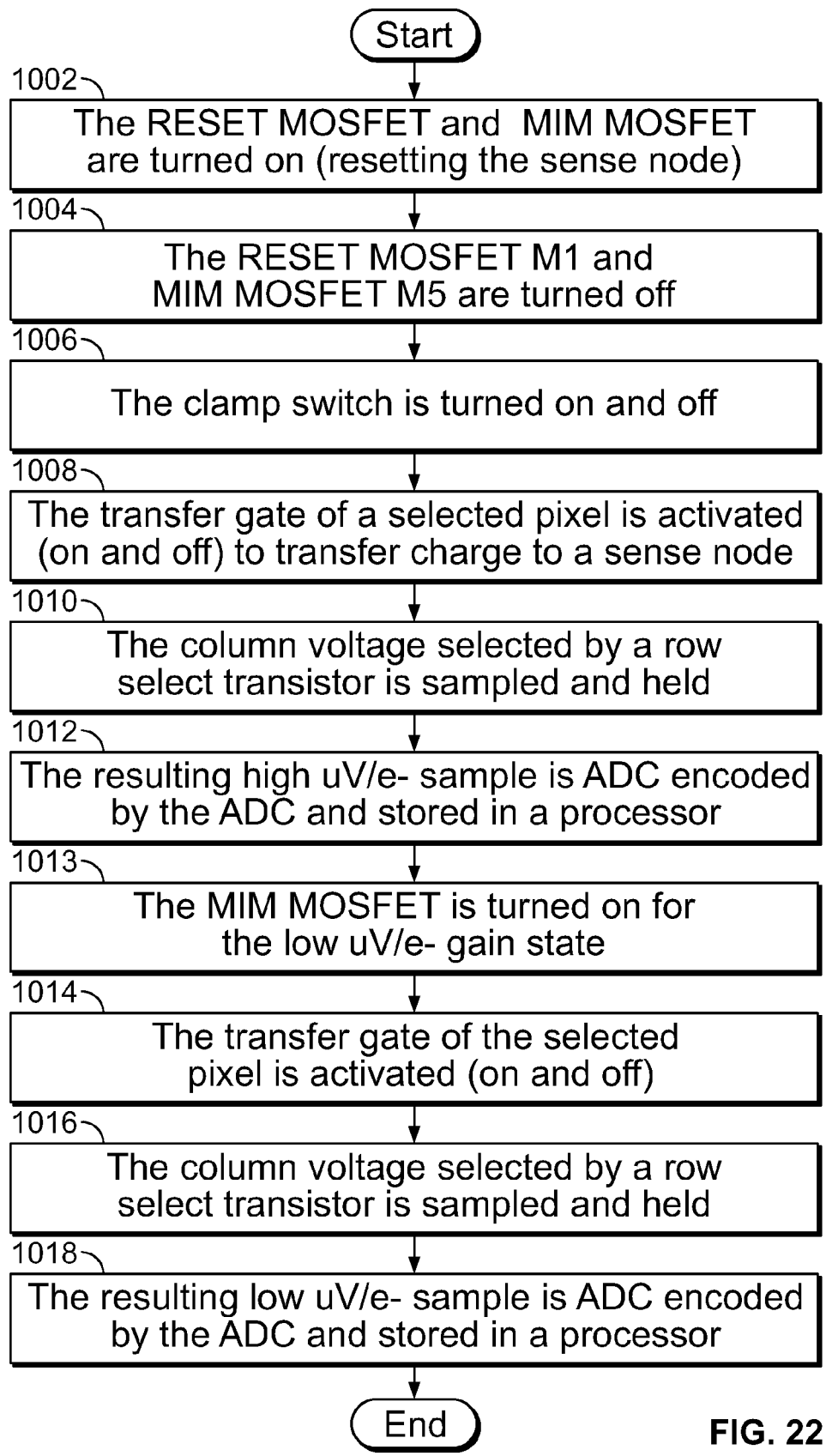
FIG. 22 is a pixel operation flow illustrating exemplary steps for a substantially simultaneous readout of both low and high gain in one step using the pixel and analog signal processing circuits of FIG. 20 and the aCDS circuit of FIG. 21, according to an embodiment of the present invention.

FIG. 22 is a process flow illustrating exemplary steps for a substantially simultaneous readout of both low and high gain in one step using the pixel 414a and analog signal processing circuits 492 of FIG. 20 and the aCDS circuit of FIG. 21, according to an embodiment of the present invention. Initially, measurement is performed in the high uV/e– gain state (i.e., the MIM MOSFET 404 is off). In step 1002, the RESET MOSFET M1 and MIM MOSFET M5 are turned on (resetting the sense node). In step 1004, the RESET MOSFET M1 and MIM MOSFET M5 are turned off. In step 1006, the clamp switch is turned on and off as implemented in correlated double sampling circuits. In step 1008, TG (i.e., the transfer gate of the pixel 414a, not shown) is activated (on and off) to transfer charge to a sense node. In step 1010, the column voltage selected by the row select transistor M3 at input Sel is sampled and held. In step 1012, the resulting high uV/e– sample is ADC encoded by the ADC and stored in a processor (not shown).

Next, in step 1013, the MIM MOSFET M5 is turned on for the low uV/e– gain state. In step 1014, TG is activated (on and off). In step 1016, the column voltage selected by the row select transistor M3 at input Sel is sampled and held. In step 1018, the low uV/e– sample is encoded by the ADC and stored in the processor.

Figure 23:
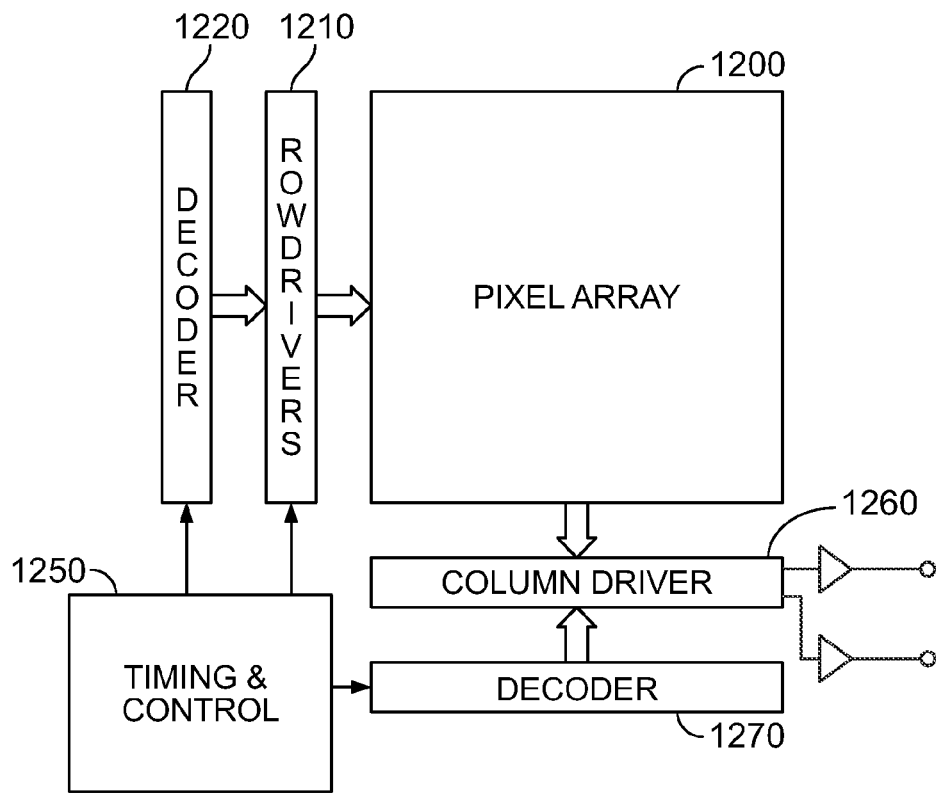
FIG. 23 is a block diagram for a complete CMOS imager having a pixel array with each pixel cell being constructed in the manner shown in FIG. 20, according to an embodiment of the present invention.

FIG. 23 is a block diagram for a complete CMOS imager having a pixel array 1200 with each pixel cell being constructed in the manner shown in FIG. 20, according to an embodiment of the present invention. Pixel array 1200 comprises a plurality of pixels arranged in a predetermined number of columns and rows. The pixels of each row in array 1200 are all turned on at the same time by a row select line, and the pixels of each column are selectively output by a column select line. A plurality of rows and column lines are provided for the entire array 1200 (not shown). The row lines are selectively activated by the row driver 1210 in response to row address decoder 1220 and the column select lines are selectively activated by the column driver 1260 in response to column address decoder 1270. Thus, a row and column address is provided for each pixel. The CMOS imager is operated by the control circuit 1250 which controls address decoders 1220, 1270 for selecting the appropriate row and column lines for pixel readout, and row and column driver circuitry 1210, 1260 which apply driving voltage to the drive transistors of the selected row and column lines.

Figure 24:
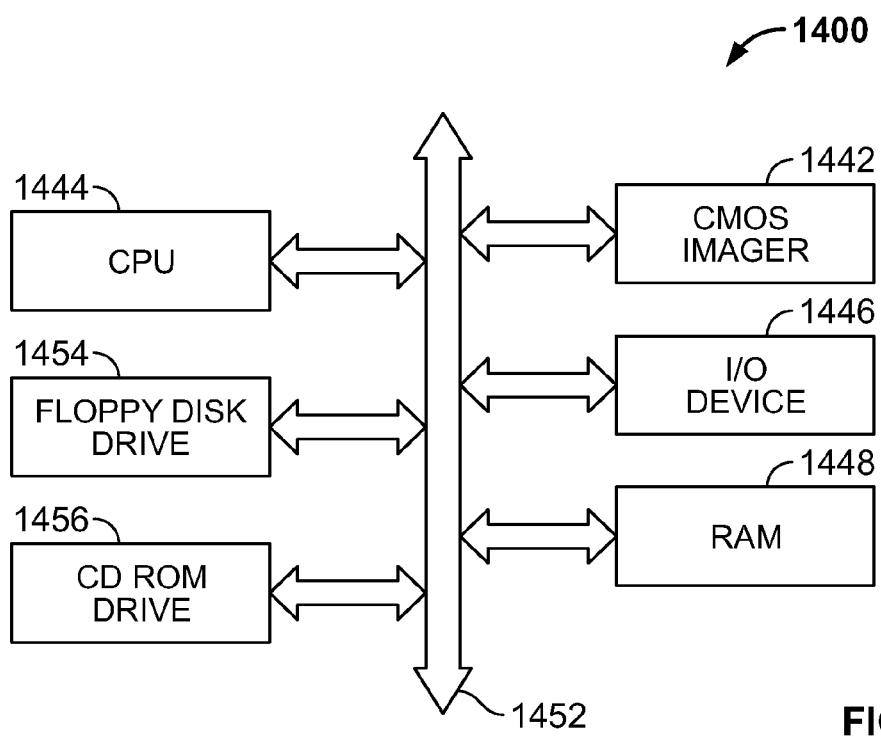
FIG. 24 is a block diagram of a processor based system which includes the CMOS imager device of FIG. 23, according to an embodiment of the present invention.

FIG. 24 is a block diagram of a processor based system which includes the CMOS imager device of FIG. 24, according to an embodiment of the present invention, illustrated generally at 1400. A processor based system is exemplary of a system having digital circuits which may include CMOS imager devices. Without being limiting, such a system may include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 1444 that communicates with an input/output (I/O) device 1446 over a bus 1452. The CMOS imager 1442 also communicates with the system over bus 1452. The computer system 1400 also includes random access memory (RAM) 1448, and, in the case of a computer system may include peripheral devices such as a floppy disk drive 1454 and a compact disk (CD) ROM drive 1456 which also communicate with CPU 1444 over the bus 1452. CMOS imager 1442 is preferably constructed as an integrated circuit which having the array and the logic as previously described with respect to FIG. 24.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A readout transistor circuit for a pixel, comprising:
a sense node of a back-illuminated CMOS imager pixel;
a reset transistor in signal communication with the sense node;
a source follower transistor in signal communication with the sense node;
a row select transistor in signal communication with the sense node;
a switching transistor in signal communication with the sense node, the switching transistor connected to a source terminal of the reset transistor; and
a capacitor connected between a source terminal of the switching transistor and ground,
wherein the switching transistor is configured to place the capacitor in signal communication with the sense node to switch between a low voltage-per-charge (V/e–) ratio and a high voltage-per-charge (V/e–) to enable low noise performance of the sense node.

2. The readout transistor circuit of claim 1, wherein the capacitor is a metal insulator-metal (MIM) capacitor.

3. The readout transistor circuit of claim 2, wherein the metal-insulator-metal (MIM) capacitor is connected in a series with the switching transistor and the reset transistor, the MIM capacitor coupled between the switching transistor and the reset transistor.

4. The readout transistor of claim 3, wherein the switching transistor is connected in parallel with the reset transistor.

5. The readout transistor circuit of claim 1, wherein at least one of the reset transistor, the source follower transistor, the row select transistor, and the switching transistor is a MOSFET.

6. The readout transistor circuit of claim 5, wherein at least one of the reset transistor, the source follower transistor, the row select transistor, and the switching transistor is a buried channel MOSFET.

7. The readout transistor circuit of claim 1, wherein the sense node comprises a photon-to-charge-converter comprising at least one of a pinned photo diode (PPD), a photo-gate, and a photodiode.

8. The readout transistor circuit of claim 1, further comprising:
a source follower transistor in signal communication with the row select transistor for outputting an analog electrical signal derived from the sense node to a column line, and
at least one of an analog signal processor and an analog-to-digital converter (ADC) in signal communication with the column line.

9. An imager, comprising:
a pixel array of CMOS imaging pixels comprising a plurality of pixels arranged in a predetermined number of columns and rows selected by a plurality of column select lines and row select lines, respectively;
wherein each pixel of the pixel array comprises:
a sense node;
a reset transistor in signal communication with the sense node;
a source follower transistor in signal communication with the sense node;
a row select transistor in signal communication with the source follower transistor;
a switching transistor in signal communication with the sense node, the switching transistor connected to a source terminal of the reset transistor; and
a capacitor between a source terminal of the switching transistor and ground;

wherein the switching transistor is configured to place the capacitor in signal communication with the sense node to switch between a low voltage-per-charge (V/e–) ratio and a high voltage-per-charge (V/e–) to enable low noise performance of the sense node.

10. The imager of claim 9, wherein the capacitor is a metal-insulator-metal (MIM) capacitor.

11. The readout transistor circuit of claim 10, wherein the metal-insultator-metal (MIM) capacitor is connected in a series with the switching transistor and the reset transistor, the MIM capacitor coupled between the switching transistor and the reset transistor.

12. The imager of claim 11, wherein at least one of the reset transistor, the source follower transistor, the row select transistor, and the switching transistor is a MOSFET.

13. The imager of claim 12, wherein at least one of the reset transistor, the source follower transistor, the row select transistor, and the switching transistor is a buried channel MOSFET.

14. The imager of claim 11, wherein the sense node comprises a photon-to-charge converter comprising a least one of a pinned photo diode (PPD), a photo-gate, and a photodiode.

15. The imager of claim 11, further comprising:
a source follower transistor in signal communication with the row select transistor for outputting an analog electrical signal derived from the sense node to a column line, and
at least one of an analog signal processor and an analog-to-digital converter (ADC) in signal communication with the column line.

16. The imager of claim 15, further comprising:
a row driver and a row address decoder in signal communication with the row driver, wherein the row driver is configured for selectively activating at least one of row select lines in response to a row address decoder;
a column driver and a column address decoder in signal communication with the column driver for selectively activating at least one of column select lines in response to the column address decoder;
a control circuit for controlling the row address decoder and column address decoder for selecting at least one row and column line for pixel readout; and
row and column driver circuitry configured for driving voltage to drive transistors of the selected at least one row and column lines.

17. The imager of claim 16, further comprising a processor in signal communication with at least one of an analog signal processor and an analog-to-digital converter (ADC).

18. The imager of claim 17, wherein the processor employs a digital correlated double sampling method whereby a reference sample and a signal sample are differenced on a pixel-by-pixel basis.

19. The imager of claim 9, wherein the switching transistor is connected in parallel with the reset transistor.

20. The method for reading a pixel in a CMOS imager array, wherein the pixel comprises a sense node; a reset transistor in a signal communication with the sense node; a source follower transistor in signal communication with the sense node; a row select transistor in signal communication with the source follower transistor; a switching transistor in signal communication with the sense node; a capacitor connected between a source terminal of the switching transistor and ground; and further comprising an analog correlated double sampling circuit having a clamp switch and an analog to digital converter (ADC), the method comprising:
operating the reset transistor and switching transistor (on and off) to reset the sense node;
operating the clamp switch (on and off);
activating a transfer gate of the pixel (on and off) to transfer charge to a sense node;
sample and holding a column voltage selected by the row select transistor; and
reading an output of the ADC to obtain a high uV/e– sample;
turning the switching transistor on to switch between high uV/e– ratio and low uV/e– positions;
repeating the activating, sample and holding, and reading processes to obtain a low uV/e– sample.

21. The method of claim 20, further comprising storing the high uV/e– sample and the low uV/e– sample in the processor.

22. The method of claim 20, wherein the reset transistor, switching transistor, clamp switch, and transfer gate are operated on and off.

* * * * *

UNITED STATES PATENT AND TRADEMARK OFFICE
CERTIFICATE OF CORRECTION

| | | |
|---|---|---|
| PATENT NO. | : 9,200,956 B2 | Page 1 of 1 |
| APPLICATION NO. | : 13/169242 | |
| DATED | : December 1, 2015 | |
| INVENTOR(S) | : James Robert Janesick | |

It is certified that error appears in the above-identified patent and that said Letters Patent is hereby corrected as shown below:

In the specification

In column 10, line 53, replace "110', 140', respectively" with -- 110', 140', 170', respectively --;
In column 13, line 40, replace "MINI MOSFET" with -- MIM MOSFET --.

Signed and Sealed this
Twenty-third Day of February, 2016

Michelle K. Lee
*Director of the United States Patent and Trademark Office*